(12) United States Patent
Handa et al.

(10) Patent No.: US 7,591,695 B2
(45) Date of Patent: Sep. 22, 2009

(54) ELECTRIC CONNECTOR FOR INTERCONNECTING AT LEAST ONE FLUORESCENT LAMP AND A CIRCUIT BOARD AND CONNECTION STRUCTURE FOR SAME

(75) Inventors: Shinsuke Handa, Osaka (JP);
Katsunori Miyazono, Osaka (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 112 days.

(21) Appl. No.: 11/819,240

(22) Filed: Jun. 26, 2007

(65) Prior Publication Data
US 2008/0207063 A1   Aug. 28, 2008

(30) Foreign Application Priority Data

Jun. 27, 2006  (JP) ............................. 2006-176802
Jun. 6, 2007   (JP) ............................. 2007-150656

(51) Int. Cl.
*H01R 13/11* (2006.01)

(52) U.S. Cl. ...................... 439/856; 439/637

(58) Field of Classification Search ............... 439/852, 439/239, 856–857, 59, 61, 263, 636–637, 439/633, 82, 56
See application file for complete search history.

(56) References Cited

U.S. PATENT DOCUMENTS

| | | | | |
|---|---|---|---|---|
| 3,024,436 | A | * | 3/1962 | Kirk ............................. 439/59 |
| 4,157,785 | A | * | 6/1979 | Freliech ....................... 236/1 G |
| 4,915,637 | A | | 4/1990 | Ogawa et al. |
| 5,554,040 | A | * | 9/1996 | Sugiura et al. .............. 439/212 |
| 5,769,673 | A | * | 6/1998 | Ohta et al. ................... 439/852 |
| 6,095,873 | A | | 8/2000 | Muramatsu et al. |
| 6,196,884 | B1 | | 3/2001 | Tanaka |

(Continued)

FOREIGN PATENT DOCUMENTS

JP         61-33385           2/1986

(Continued)

OTHER PUBLICATIONS

Korean Office Action, App. No. 10-2007-062267, Dec. 7, 2007 (7 pages).

(Continued)

*Primary Examiner*—Michael C Zarroli
(74) *Attorney, Agent, or Firm*—Rader, Fishman & Grauer, PLLC

(57) ABSTRACT

An electric connector to be attached to a plate-like connection member having an edge portion, a plurality of insertion convex portions formed sideways at the edge portion, and a conductive portion formed on at least one of the front surface and the back surface of each insertion convex portion includes an insulating housing and a contact forming member made of a metal and held in the housing. The contact forming member includes a box-like portion having four walls and a connection member connecting contact extended from at least one of the walls of the box-like portion. The four walls define an insertion concave portion into which the insertion convex portion corresponding thereto is inserted along a predetermined insertion direction. The connection member connecting contact includes a contact portion that makes contact with the conductive portion of the corresponding insertion convex portion inserted into the insertion concave portion.

35 Claims, 29 Drawing Sheets

U.S. PATENT DOCUMENTS

| | | |
|---|---|---|
| 6,402,571 B1 | 6/2002 | Muller et al. |
| 2002/0077001 A1 | 6/2002 | Chen |

FOREIGN PATENT DOCUMENTS

| | | |
|---|---|---|
| JP | 62-259366 | 11/1987 |
| JP | 2-73082 | 6/1990 |
| JP | 02-260378 | 10/1990 |
| JP | 5-15368 | 2/1993 |
| JP | 08-228054 A | 9/1996 |
| JP | 10-069928 | 3/1998 |
| JP | 11-040234 A | 2/1999 |
| JP | 11-086928 | 3/1999 |
| JP | 11-214058 | 8/1999 |
| JP | 2000-331732 A | 11/2000 |
| JP | 2002-184479 | 6/2002 |
| KR | 2002-0048865 A | 6/2002 |

OTHER PUBLICATIONS

KR PO Office Action, App. No. 10-2007-0062267, Aug. 8, 2008 (7 pages).

Office Action from Japanese Patent Office for application No. 2007-150656 dated Sep. 21, 2007 w/ English translation.

* cited by examiner

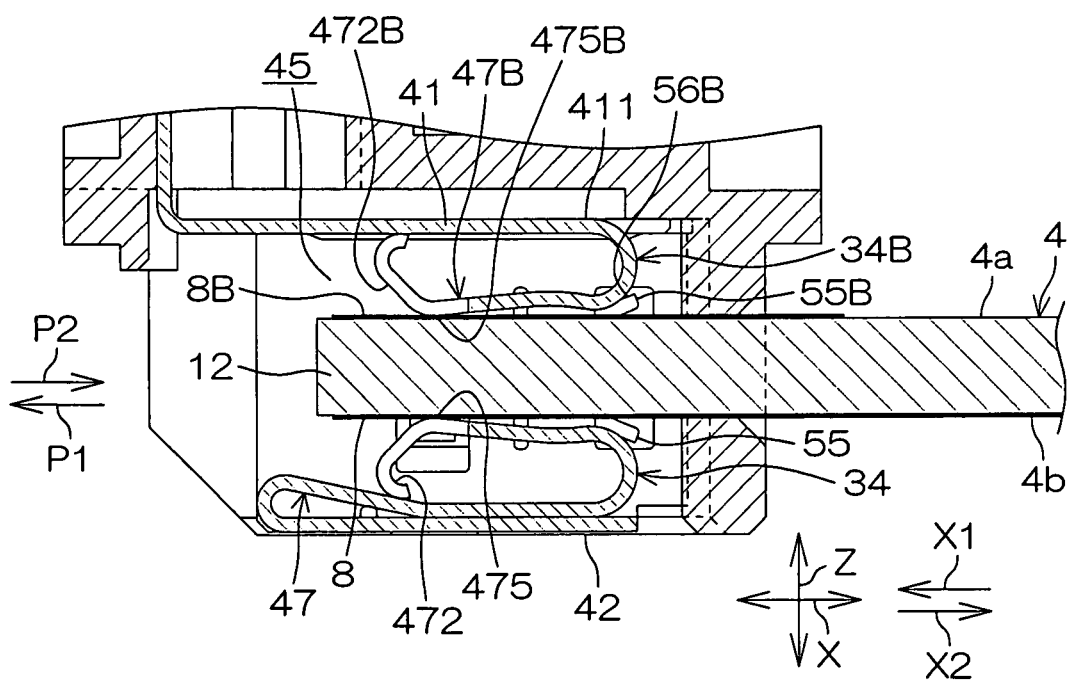

ELECTRIC CONNECTOR FOR INTERCONNECTING AT LEAST ONE FLUORESCENT LAMP AND A CIRCUIT BOARD AND CONNECTION STRUCTURE FOR SAME

BACKGROUND OF THE INVENTION

1. Field of the Invention

The present invention relates to an electric connector and a connection structure for the electric connector.

2. Description of Related Arts

Usually, an electric connector has a housing made of a synthetic resin and a contact made of a metal and held in the housing (refer to, for example, Document 1 below).

Document 1: Japanese Unexamined Patent Publication No. 2000-331732 (publication date: Nov. 30, 2000)

The contact has a base portion secured to the housing, a slender bent portion extending in an S-shape from the base portion, and a protruding contact portion provided at the tip end of the bent portion. The contact portion makes contact with a conductive pattern formed on the front surface of a circuit board and is pressed thereby. Hence, the bent portion is deformed elastically, and an elastic reaction force is applied from the bent portion to the conductive pattern. As a result, contact pressure is generated between the contact portion and the conductive pattern.

For example, a configuration can be conceived in which a receiving portion being opposed to a contact portion with a clearance provided therebetween is formed in a housing and the receiving portion receives a circuit board inserted between the contact portion and the receiving portion. With this configuration, the circuit board can be prevented from being away from the contact portion, and contact pressure between the conductive pattern and the contact portion can be maintained.

However, if the housing is heated to a high temperature owing to, for example, heat generation of the circuit board, the resin of the housing becomes soft, and the receiving portion may be deformed. If the receiving portion is deformed, the position of the circuit board received in the receiving portion is dislocated. In this case, the contact pressure between the contact portion and the conductive pattern becomes lower, and a contact failure may occur.

An object of the present invention is to provide an electric connector and a connection structure for the electric connector which are capable of stably maintaining the contact pressure applied to a circuit board and the like.

SUMMARY OF THE INVENTION

To achieve the object described above, in a preferable aspect of the present invention, an electric connector to be attached to a plate-like connection member having an edge portion, a plurality of insertion convex portions formed sideways at the edge portion, and a conductive portion formed on at least one of the front surface and the back surface of each insertion convex portion includes an insulating housing and a contact forming member made of a metal and held in the housing. The contact forming member includes a box-like portion having four walls and a connection member connecting contact extended from at least one of the walls of the box-like portion. The four walls define an insertion concave portion into which the insertion convex portion corresponding thereto is inserted along a predetermined insertion direction. The connection member connecting contact includes a contact portion that makes contact with the conductive portion of the corresponding insertion convex portion inserted into the insertion concave portion.

In this embodiment, the insertion convex portion inserted into the insertion concave portion is wrapped with the box-like portion. Hence, the insertion convex portion to which contact pressure is applied from the connection member connecting contact can be received by the box-like portion so as not to come off from the connection member connecting contact. Hence, the contact pressure between the connection member connecting contact and the conductive portion can be sufficiently secured. In addition, since the box-like portion is made of a metal, it can be prevented from being softened and deformed by heat in a temperature condition (for example, up to a hundred and several tens of degrees C.) in which the electric connector is used. As a result, the box-like portion for receiving the insertion convex portion can receive the insertion convex portion without being deformed by heat, regardless of the temperature condition at the time of use. Hence, the contact pressure can be maintained stably.

BRIEF DESCRIPTION OF THE DRAWINGS

FIG. 18 is a sectional view showing a main part, showing a state in which an insertion convex portion is inserted into an insertion concave portion shown in FIG. 16;

Figure 19A:
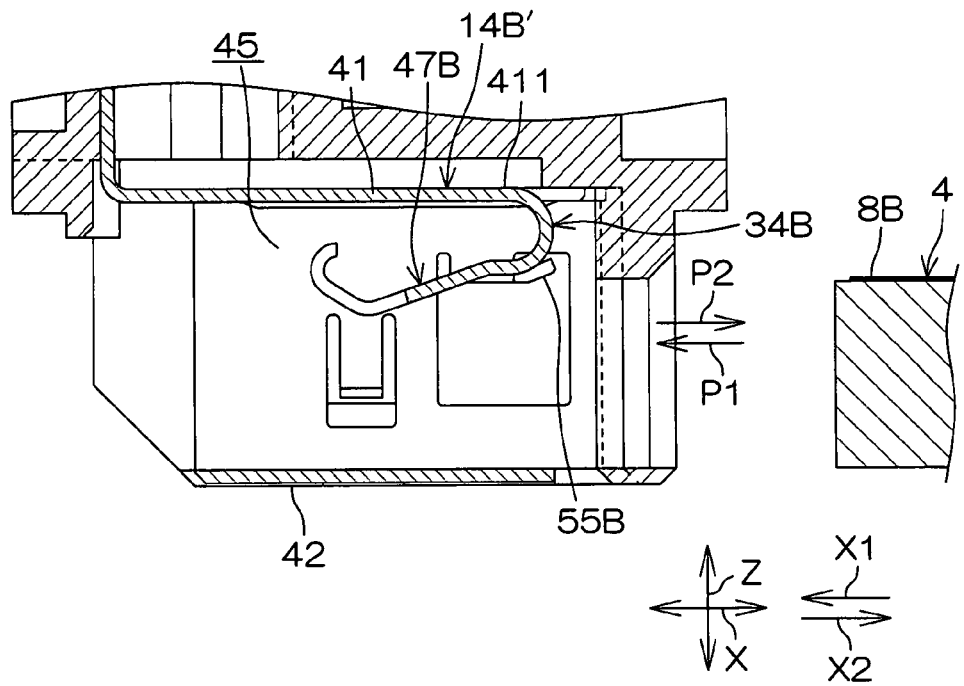
FIG. 19A is a sectional view showing a main part according to still another embodiment of the present invention, and FIG.
Figure 20A:
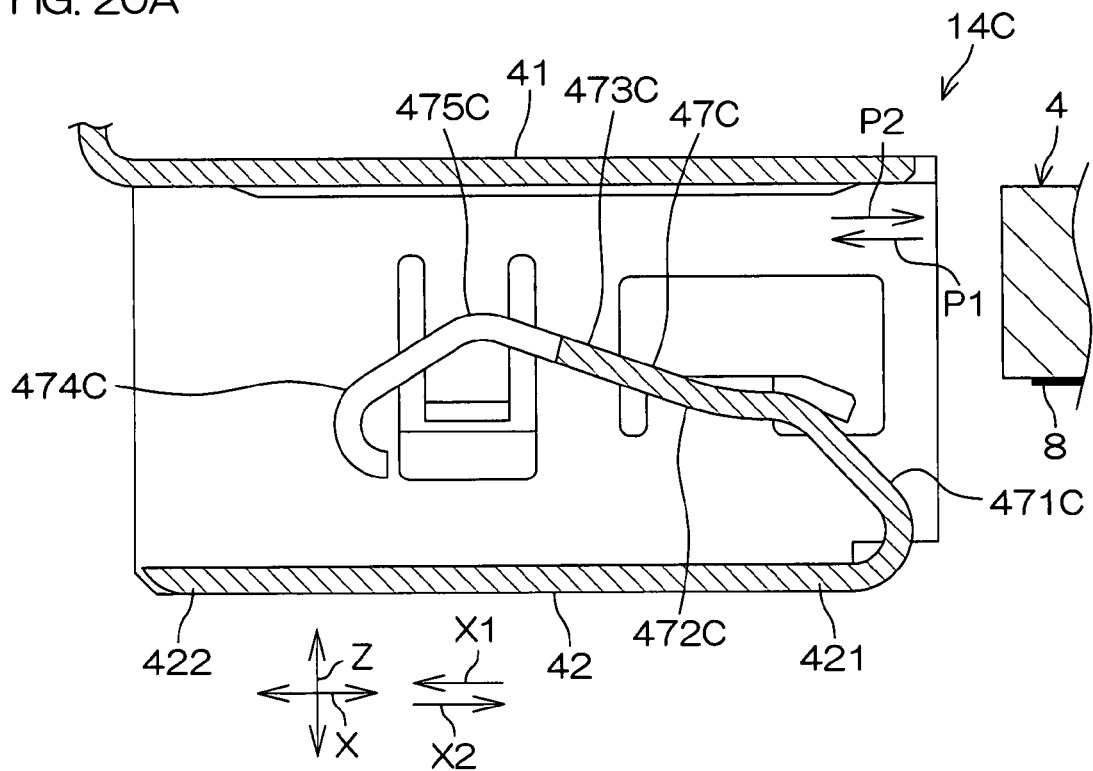
Figure 20B:
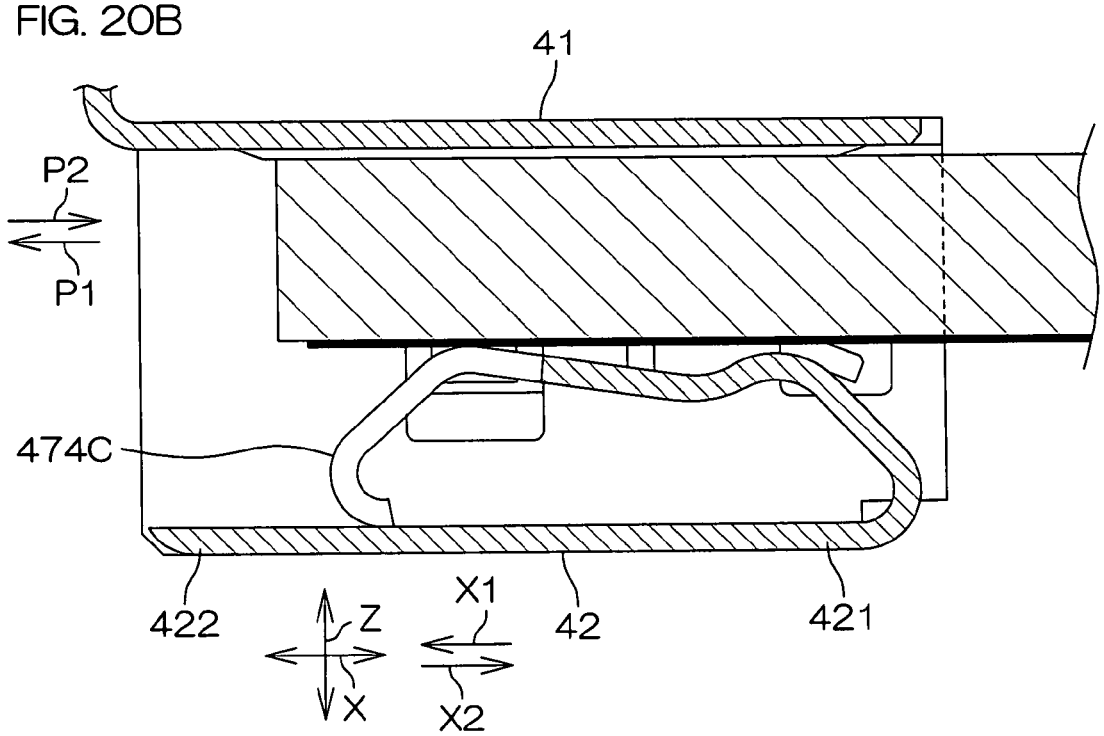
Figure 21A:
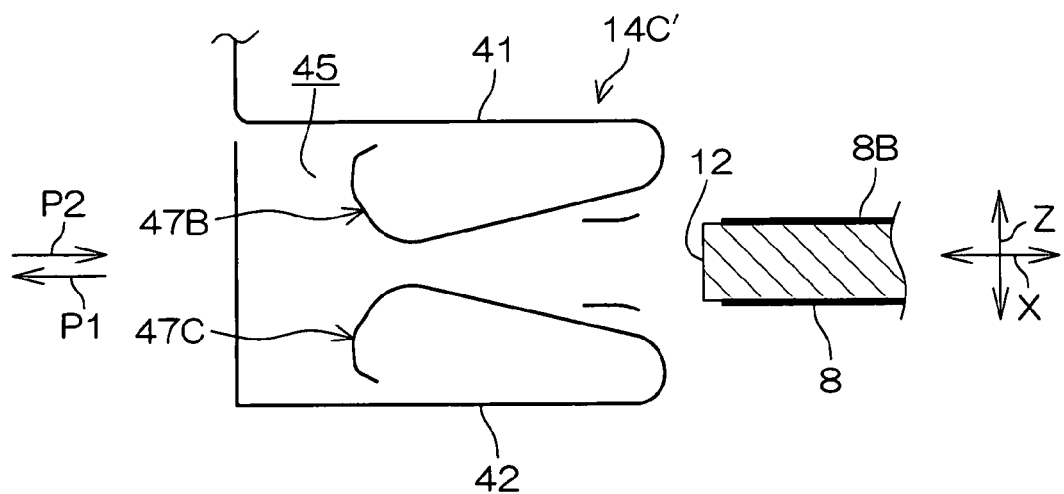
Figure 21B:
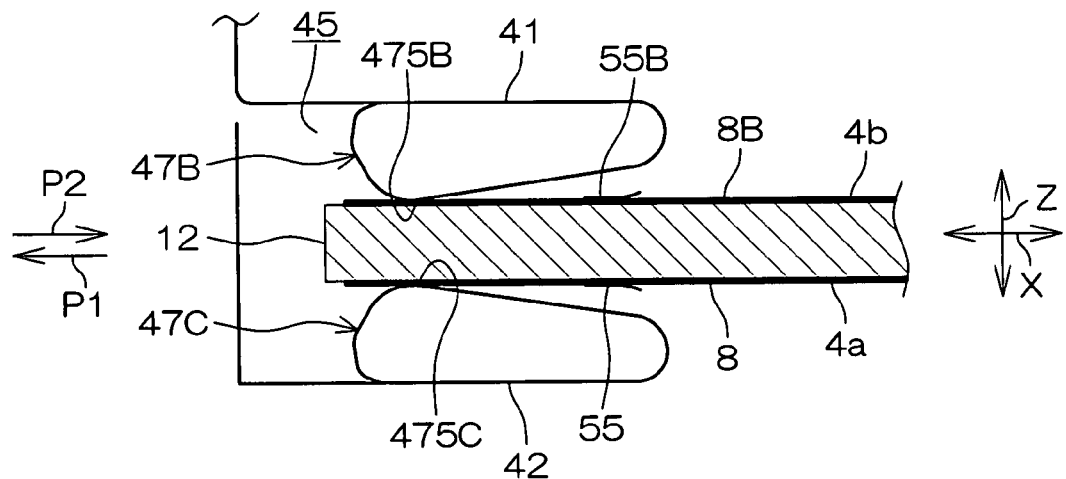
Figure 22:
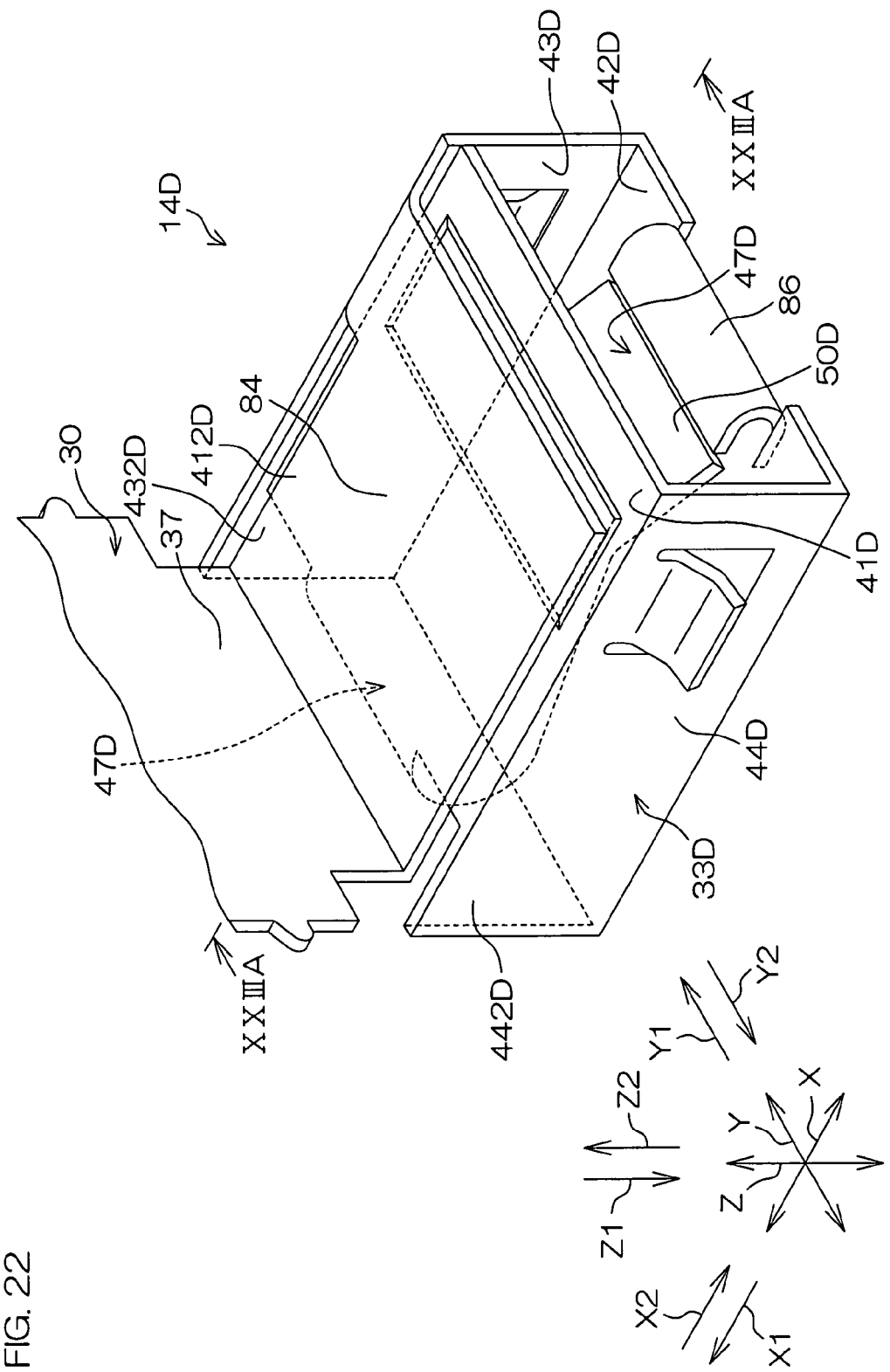
Figure 23A:
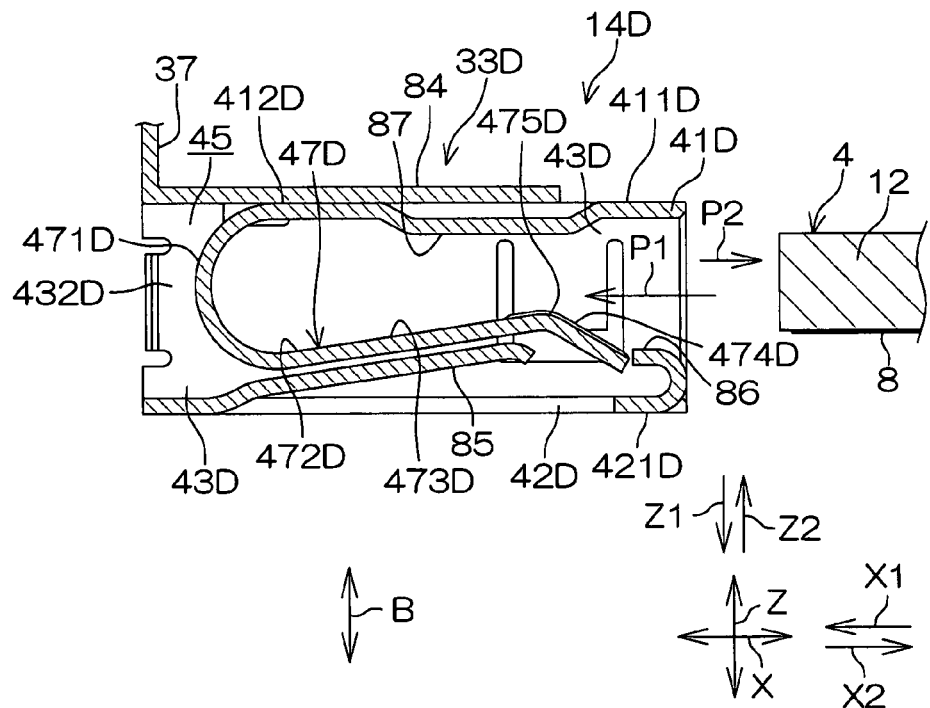
Figure 23B:
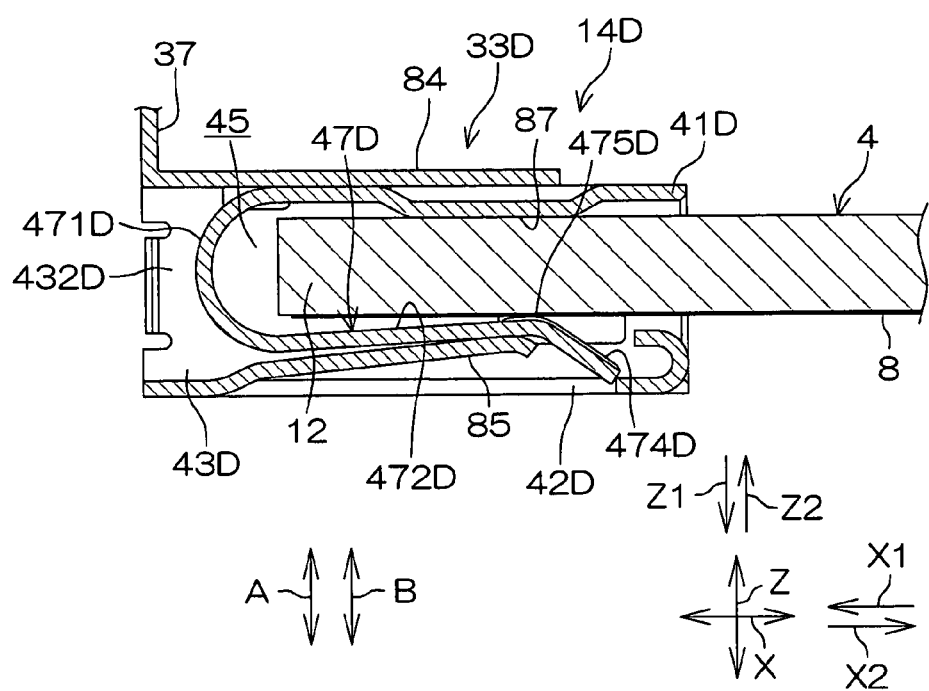
Figure 24A:
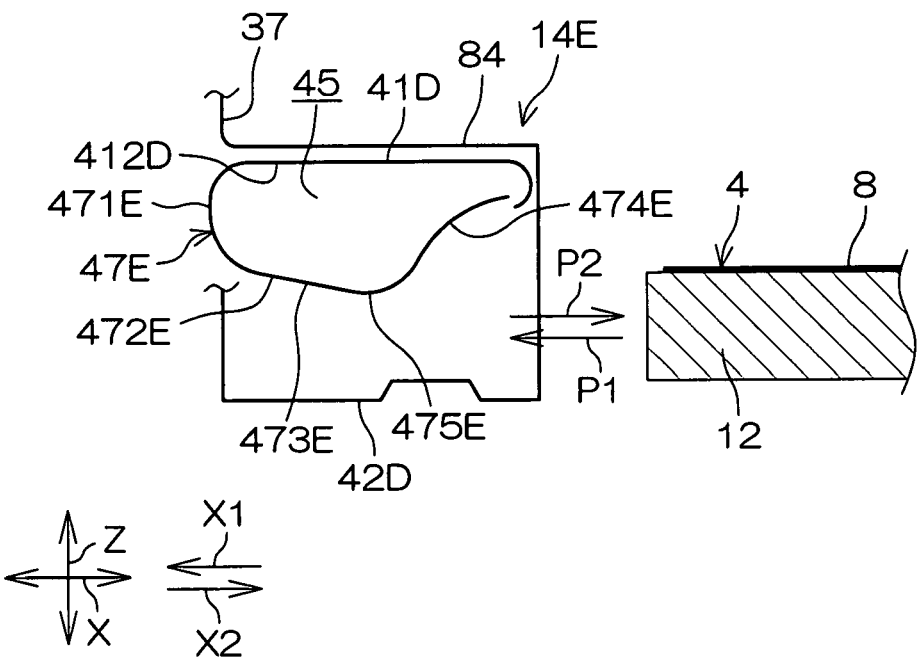
Figure 24B:
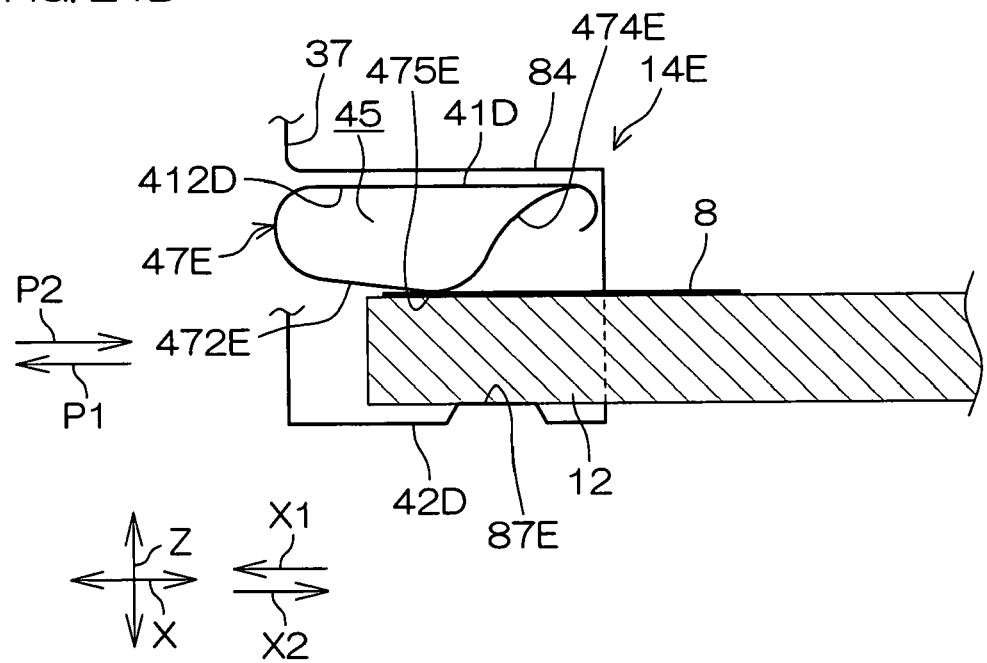
Figure 25A:
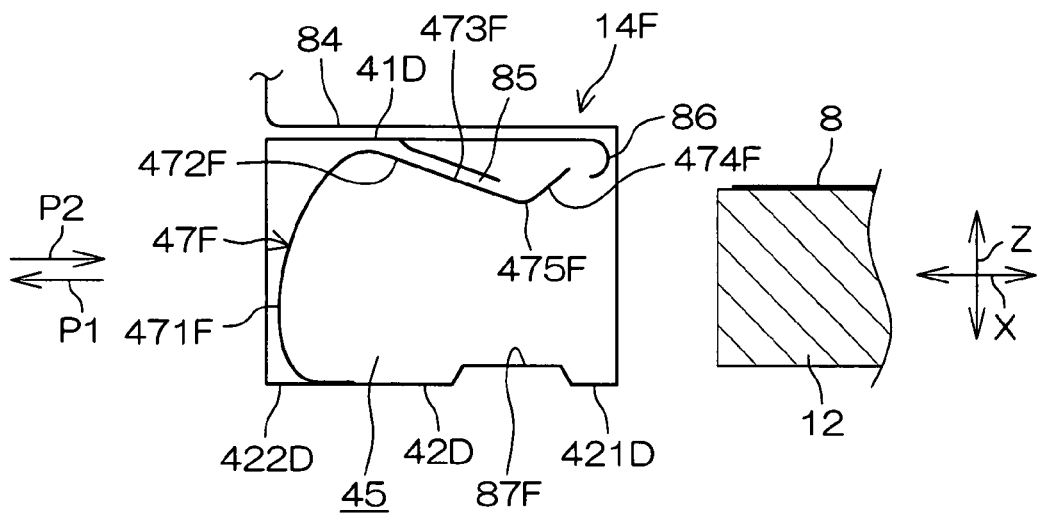
Figure 25B:
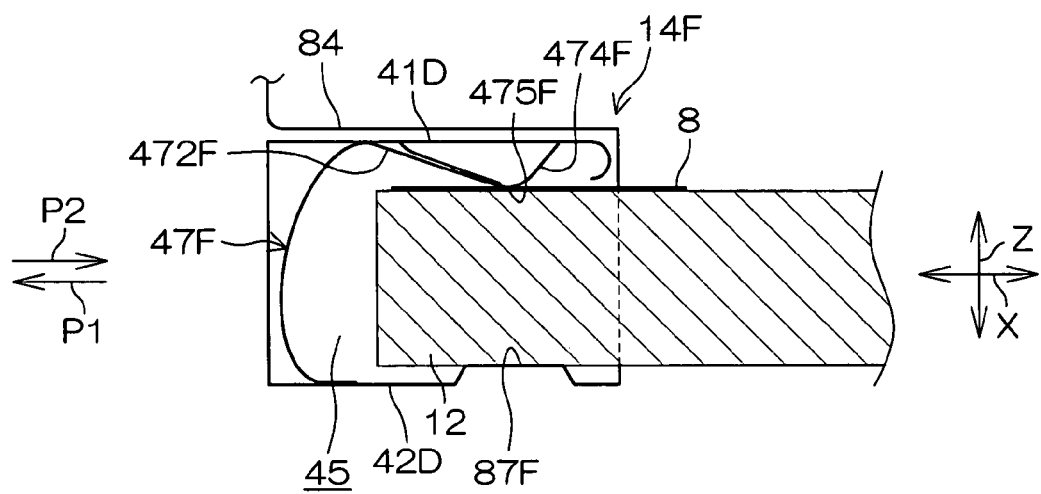
Figure 26A:
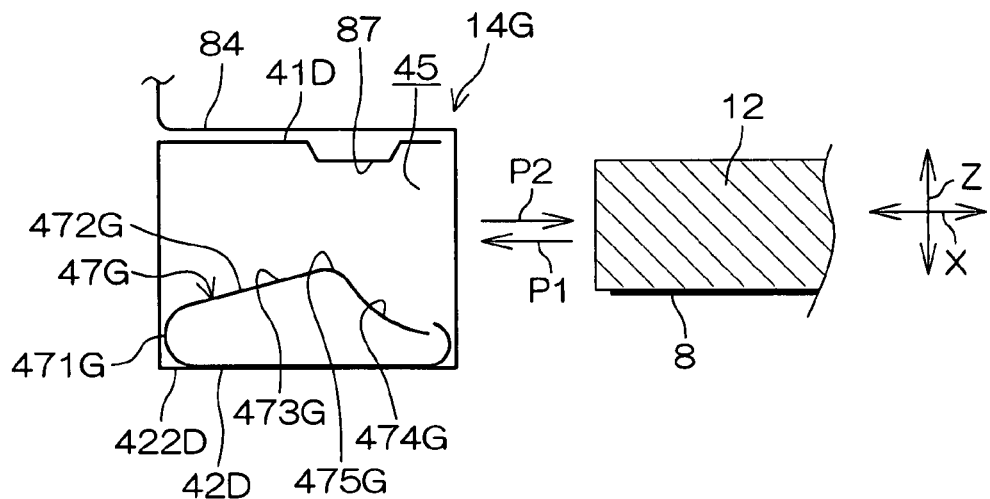
Figure 26B:
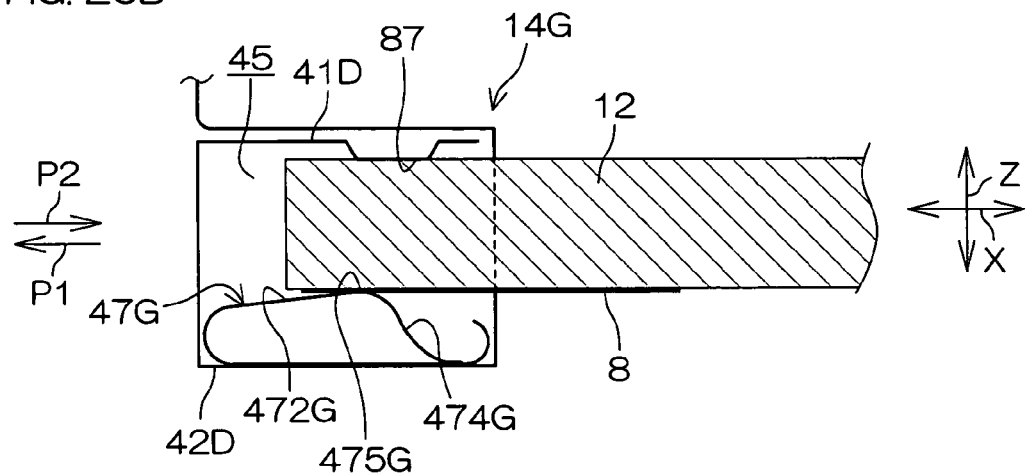
Figure 27A:
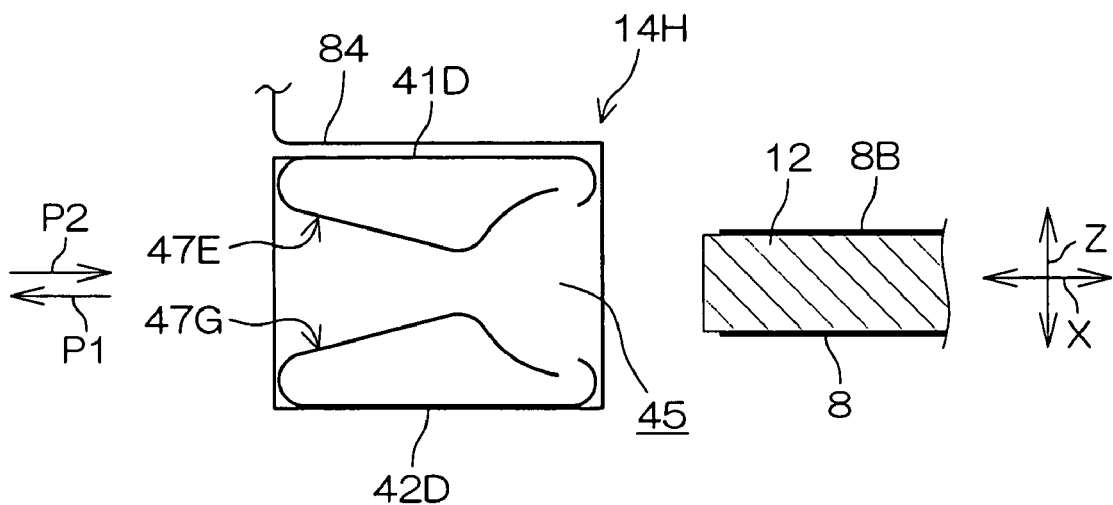
Figure 27B:
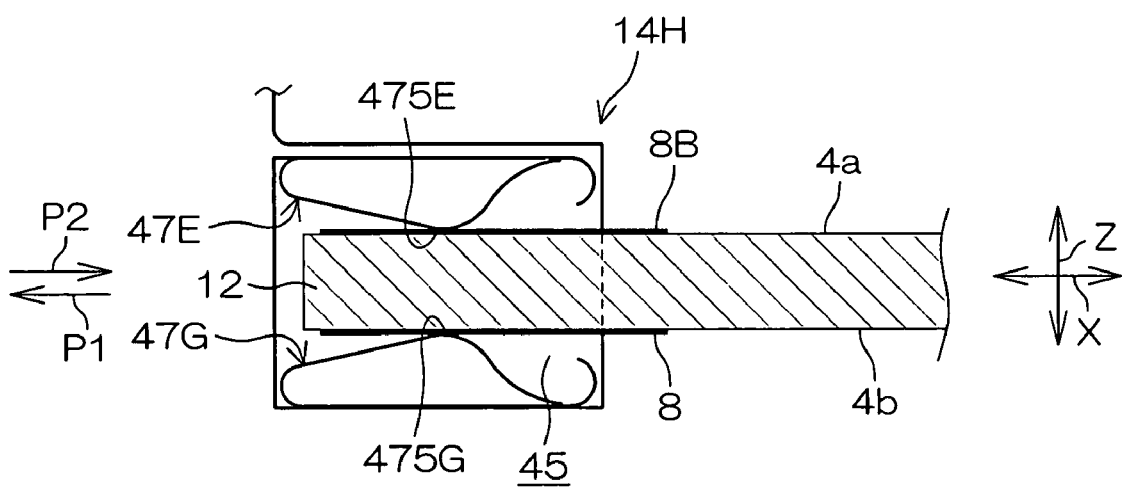
Figure 28A:
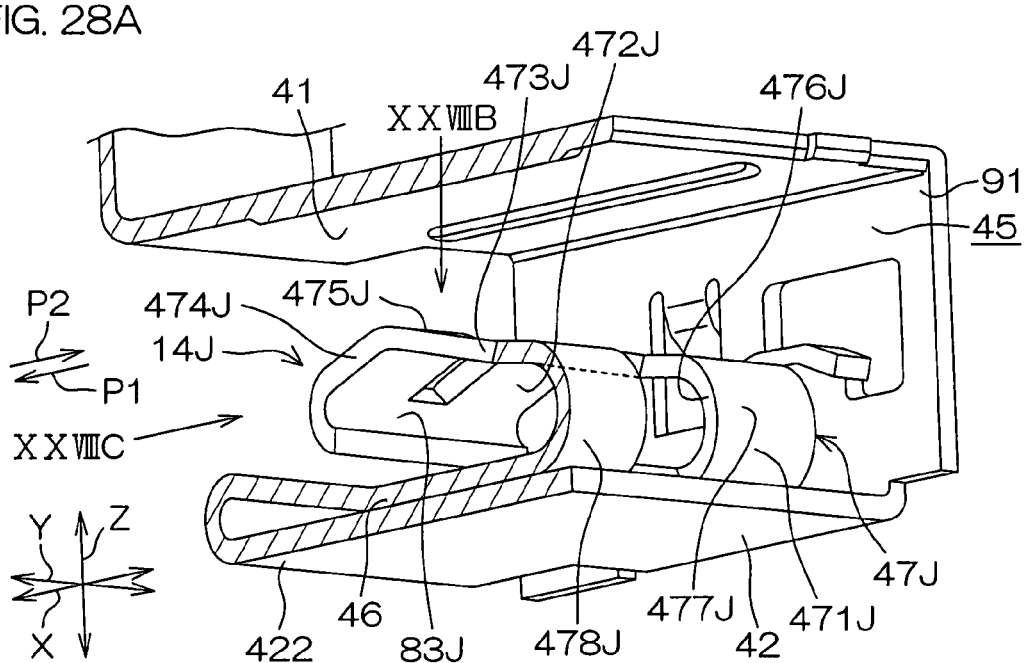
Figure 28B:
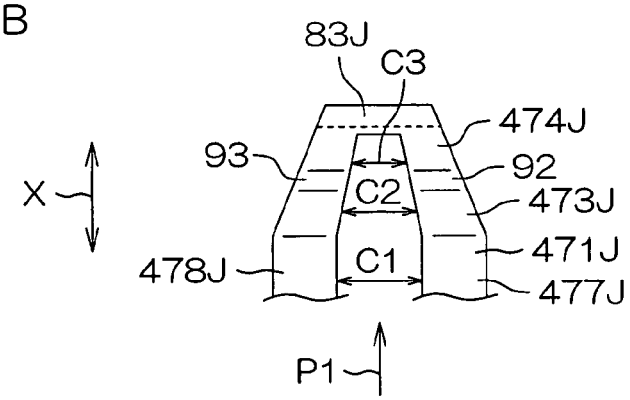
Figure 28C:
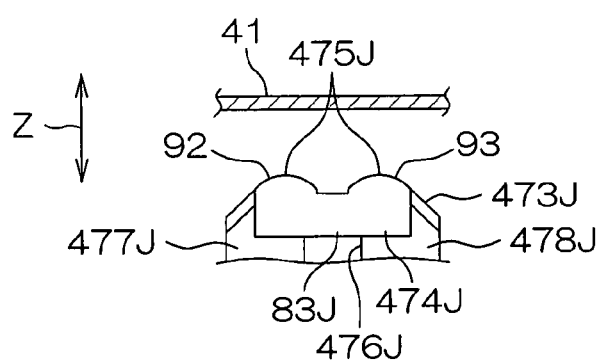
Figure 29A:
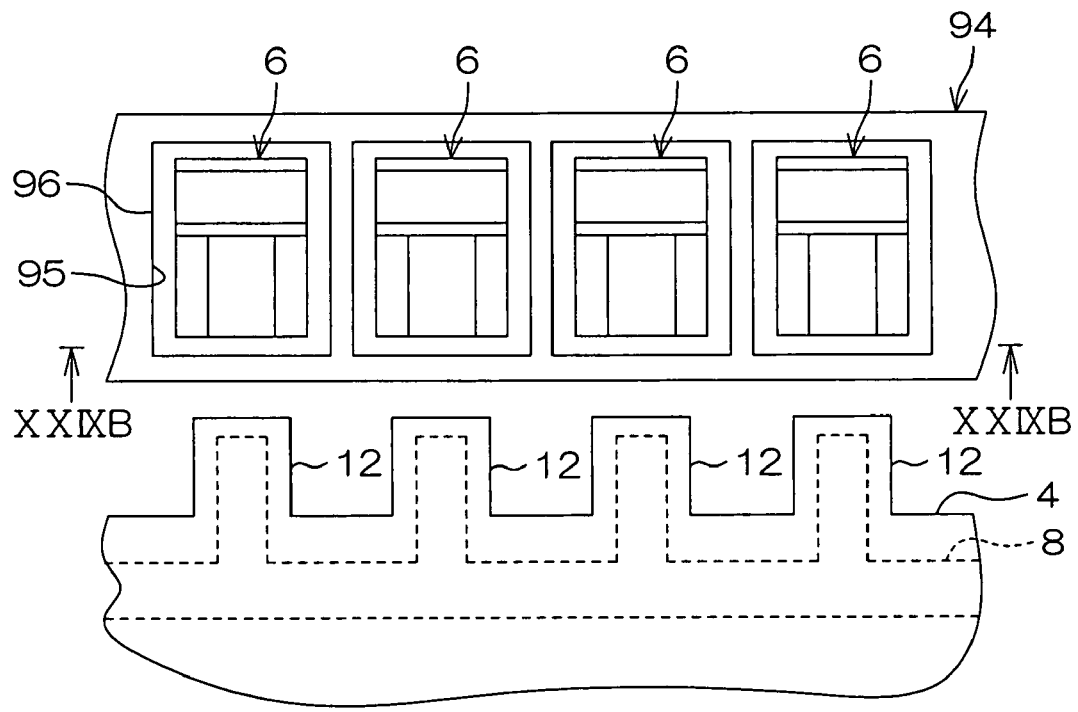
Figure 29B:
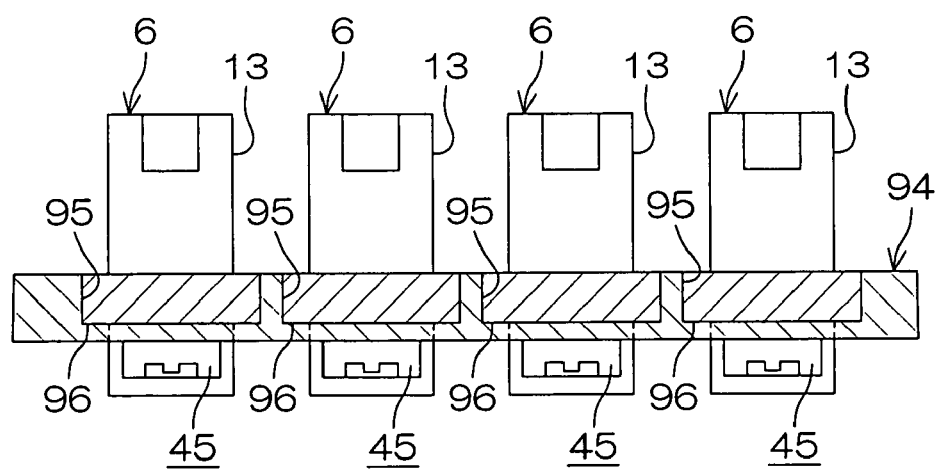
Figure 30:
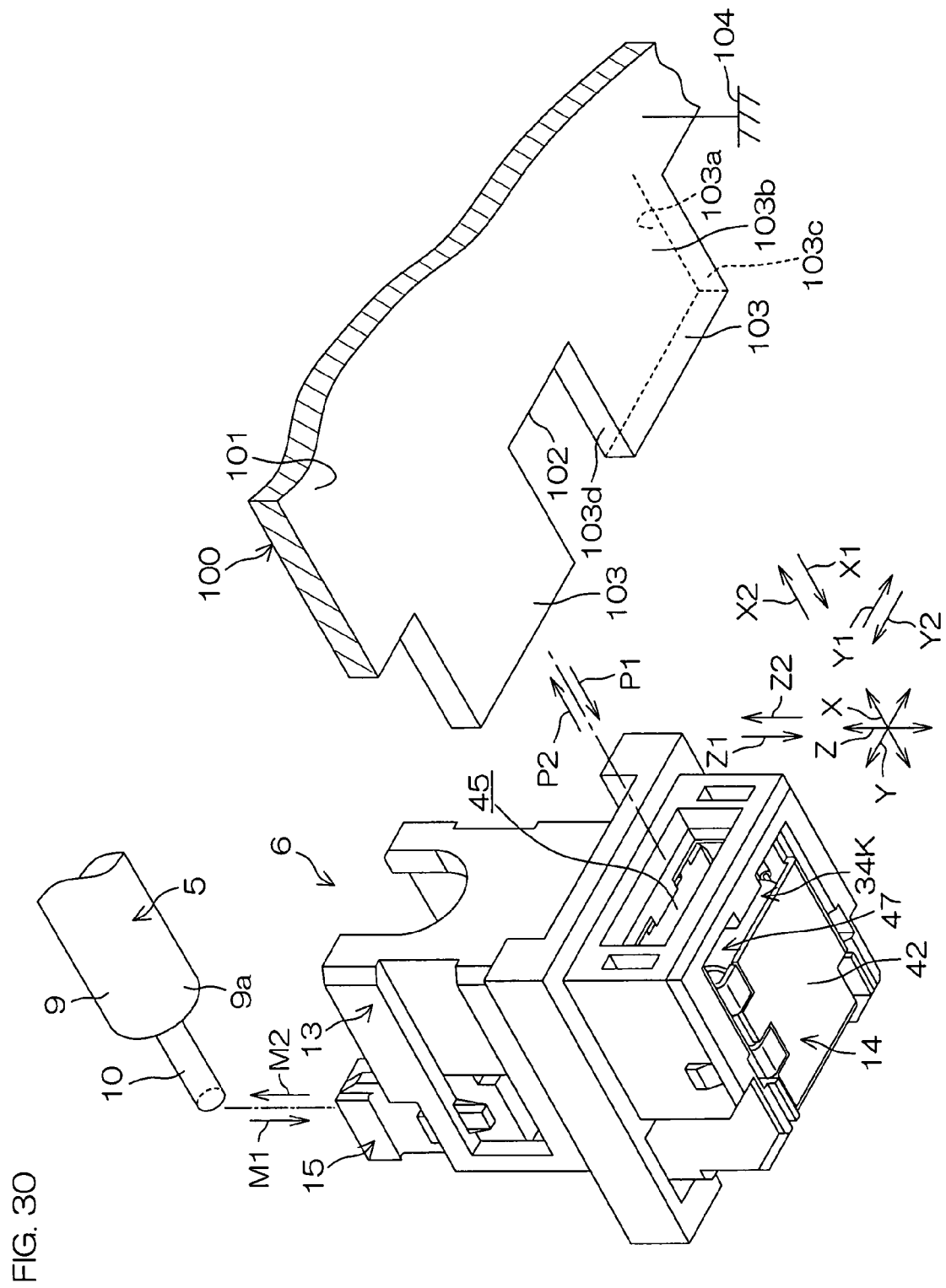
Figure 31:
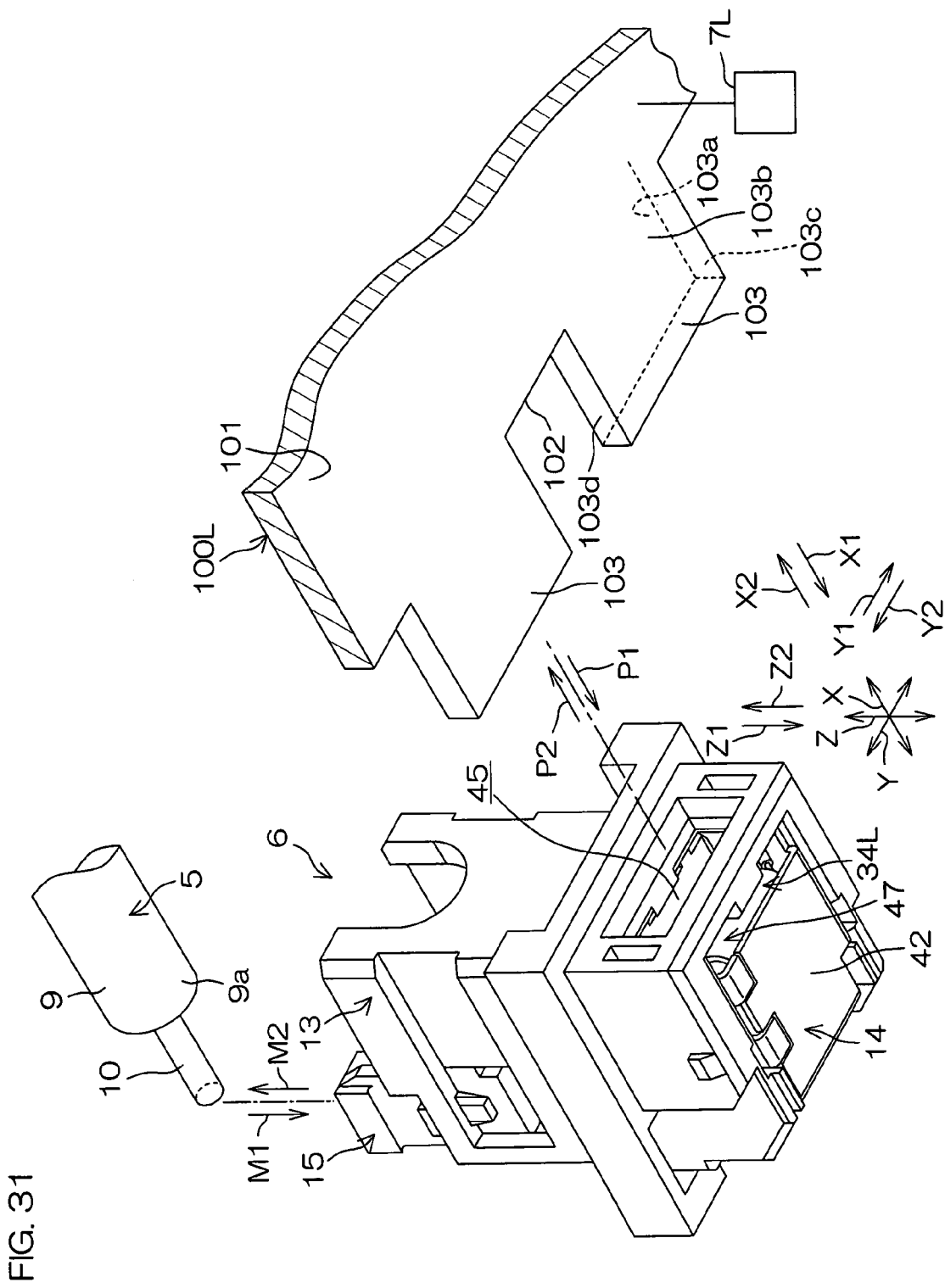
Figure 32:
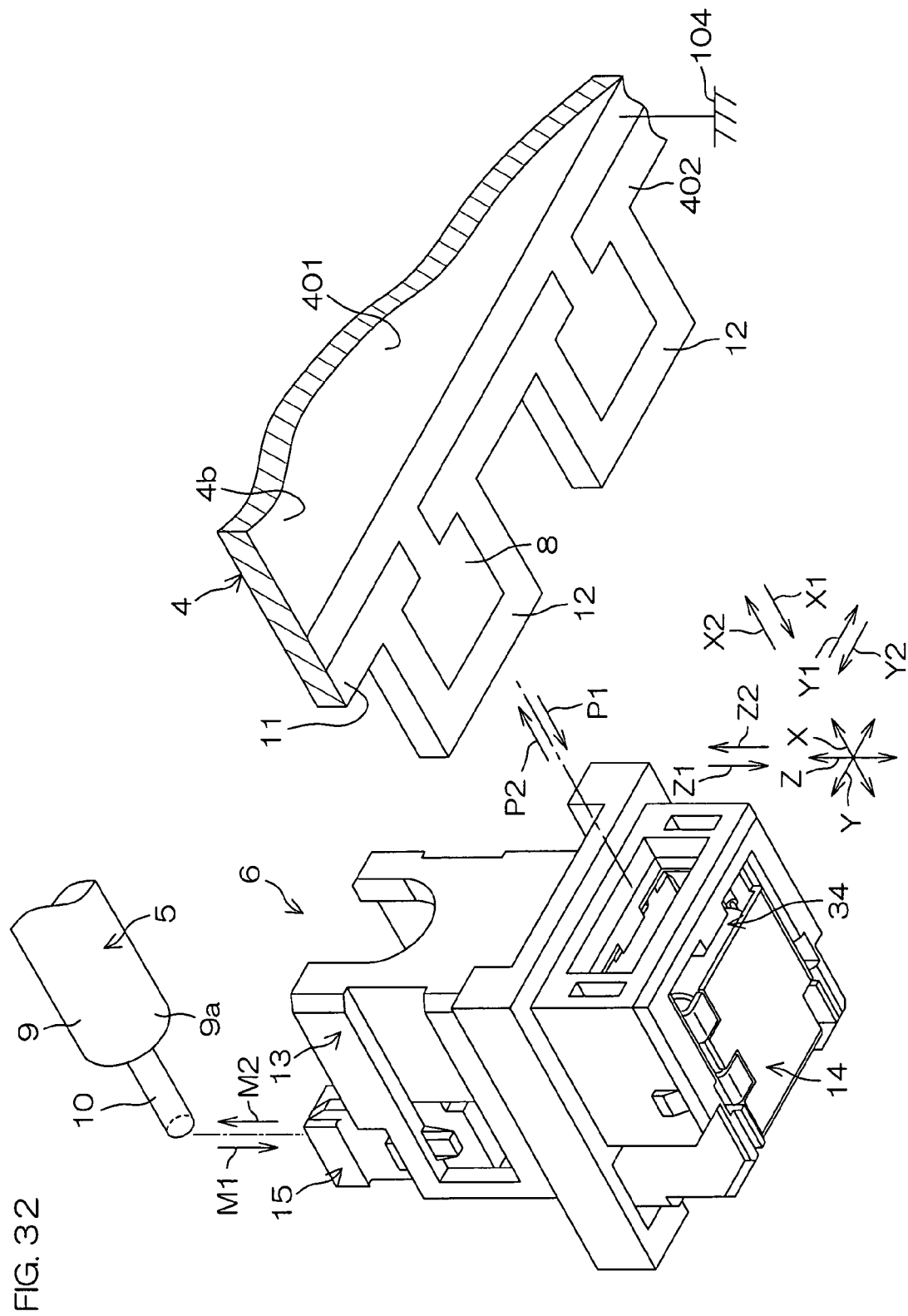

19B shows a state in which an insertion convex portion is inserted into an insertion concave portion shown in FIG. 19A;

FIG. 20A is a sectional view showing a main part according to still another embodiment of the present invention, and FIG. 20B shows a state in which an insertion convex portion is inserted into an insertion concave portion shown in FIG. 20A;

FIG. 21A is a sectional view showing a main part according to still another embodiment of the present invention, and FIG. 21B shows a state in which an insertion convex portion is inserted into an insertion concave portion shown in FIG. 21A;

FIG. 22 is a perspective view showing a main part according to still another embodiment of the present invention;

FIG. 23A is a sectional view taken along the line XXIIIA-XXIIIA of FIG. 22, and FIG. 23B shows a state in which an insertion convex portion is inserted into an insertion concave portion shown in FIG. 23A;

FIG. 24A is a sectional view showing a main part according to still another embodiment of the present invention, and FIG. 24B shows a state in which an insertion convex portion is inserted into an insertion concave portion shown in FIG. 24A;

FIG. 25A is a sectional view showing a main part according to still another embodiment of the present invention, and FIG. 25B shows a state in which an insertion convex portion is inserted into an insertion concave portion shown in FIG. 25A;

FIG. 26A is a sectional view showing a main part according to still another embodiment of the present invention, and FIG. 26B shows a state in which an insertion convex portion is inserted into an insertion concave portion shown in FIG. 26A;

FIG. 27A is a sectional view showing a main part according to still another embodiment of the present invention, and FIG. 27B shows a state in which an insertion convex portion is inserted into an insertion concave portion shown in FIG. 27A;

FIG. 28A is a perspective sectional view showing a main part according to still another embodiment of the present invention, FIG. 28B is a view showing a main part viewed along the arrow XXVIIIB of FIG. 28A, and FIG. 28C is a view showing the main part viewed along the arrow XXVIIIC of FIG. 28A;

FIG. 29A is a schematic plan view showing a main part according to still another embodiment of the present invention, and FIG. 29B is a sectional view taken along the line XXIXB-XXIXB of FIG. 29A;

FIG. 30 is a perspective view showing a main part according to still another embodiment of the present invention;

FIG. 31 is a perspective view showing a main part according to still another embodiment of the present invention; and FIG. 32 is a perspective view showing a main part according to still another embodiment of the present invention.

DETAILED DESCRIPTION OF THE PREFERRED EMBODIMENT

Preferred embodiments of the present invention will be described below referring to the accompanying drawings.

Figure 1:
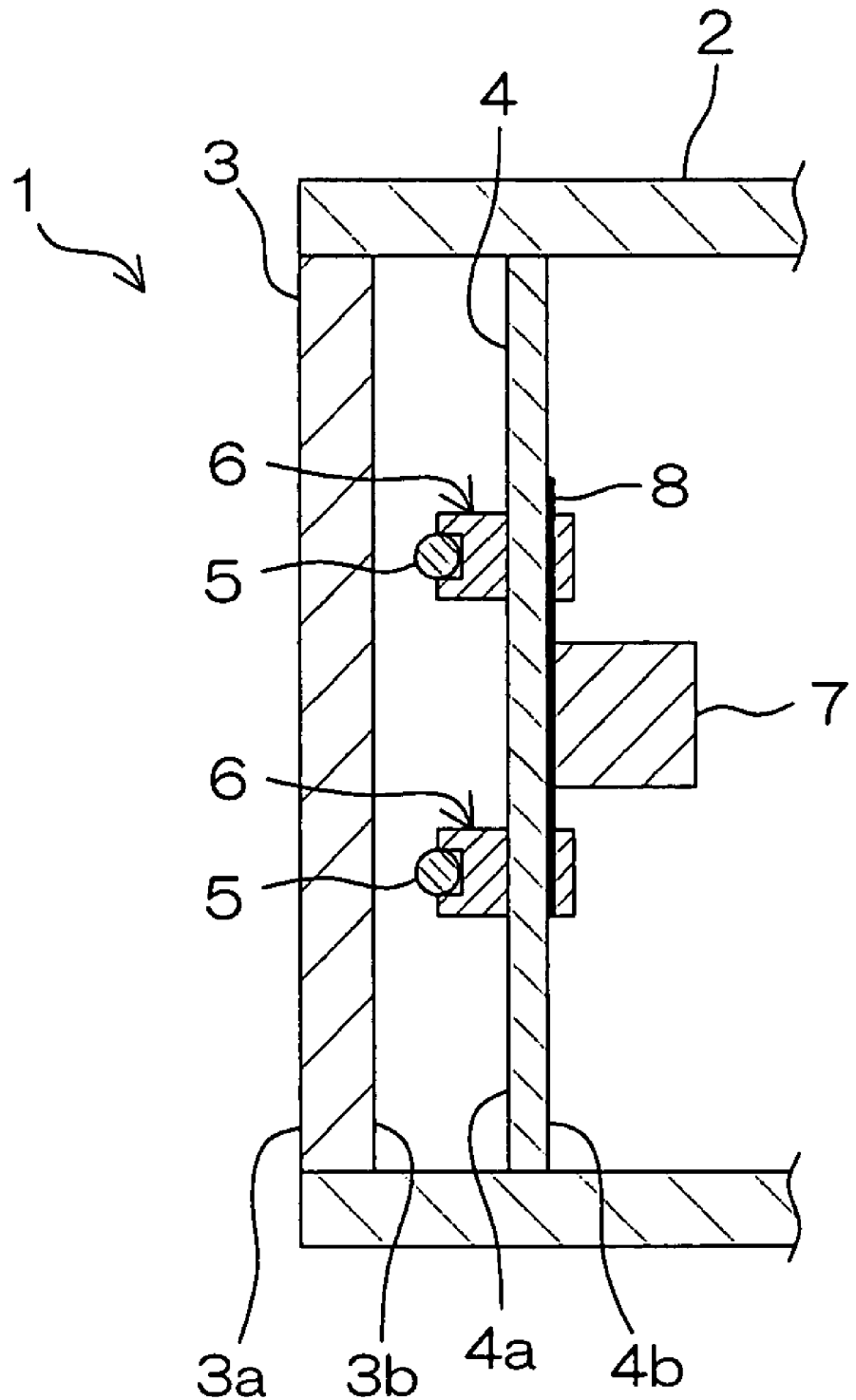
FIG. 1 is a schematic sectional view showing a general configuration of a liquid crystal display device equipped with electric connectors and a connection structure for the electric connector according to an embodiment of the present invention.

FIG. 1 is a schematic sectional view showing a general configuration of a liquid crystal display device equipped with electric connectors and a connection structure for the electric connector according to an embodiment of the present invention. Referring to FIG. 1, the liquid crystal display device 1 is used for a television or a monitor of a personal computer, for example.

The liquid crystal display device 1 includes a housing 2, a liquid crystal panel 3, a circuit board 4 serving as a connection member, cold-cathode tubes 5 serving as fluorescent tubes, a plurality of electric connectors 6, and an inverter circuit 7. The connection structure for the electric connector is formed by the circuit board 4 and the plurality of electric connectors 6 attached to the circuit board 4.

The liquid crystal panel 3 is a non-light emitting type panel and is attached to the opening on the front side of the housing 2. A front surface 3a of the liquid crystal panel 3 faces the front side of the housing 2, and a back surface 3b thereof faces the rear side of the housing 2.

The circuit board 4 is a plate-like member disposed generally parallel with the liquid crystal panel 3 and secured inside the housing 2. The circuit board 4 has a front surface 4a opposed to the back surface 3b of the liquid crystal panel 3 and a back surface 4b facing the opposite side of the front surface 4a. Conductive patterns 8 serving as conductive portions are formed on the back surface 4b of the circuit board 4.

The cold-cathode tubes 5 serve as the backlight of the liquid crystal panel 3. A plurality of the cold-cathode tubes 5 are provided between the back surface 3b of the liquid crystal panel 3 and the front surface 4a of the circuit board 4 (only two cold-cathode tubes 5 are shown in FIG. 1). The number of the cold-cathode tubes 5 is, for example, two per inch of the liquid crystal panel 3.

The cold-cathode tubes 5 are disposed at predetermined intervals in the up-and-down direction of the housing 2 to emit light to the liquid crystal panel 3. The longitudinal direction of each cold-cathode tube 5 is aligned with the left-right direction of the housing 2 (a direction perpendicular to the face of the paper) and is parallel with the back surface 3b of the liquid crystal panel 3. In FIG. 1, only two cold-cathode tubes 5 and only two connectors 6 are shown.

The connector 6 is used to establish electrical connection between the cold-cathode tube 5 and the conductive pattern 8 of the circuit board 4. The connector 6 is disposed at each of a pair of end portions of the cold-cathode tube 5. The connector 6 protrudes from the front surface 4a of the circuit board 4 toward the liquid crystal panel 3.

The inverter circuit 7 is used to supply electric power to the cold-cathode tubes 5 and is attached to the back surface 4b of the circuit board 4. The inverter circuit 7 is electrically connected to the cold-cathode tubes 5 via the conductive pattern 8 of the circuit board 4 and the connectors 6 corresponding thereto.

Figure 2:
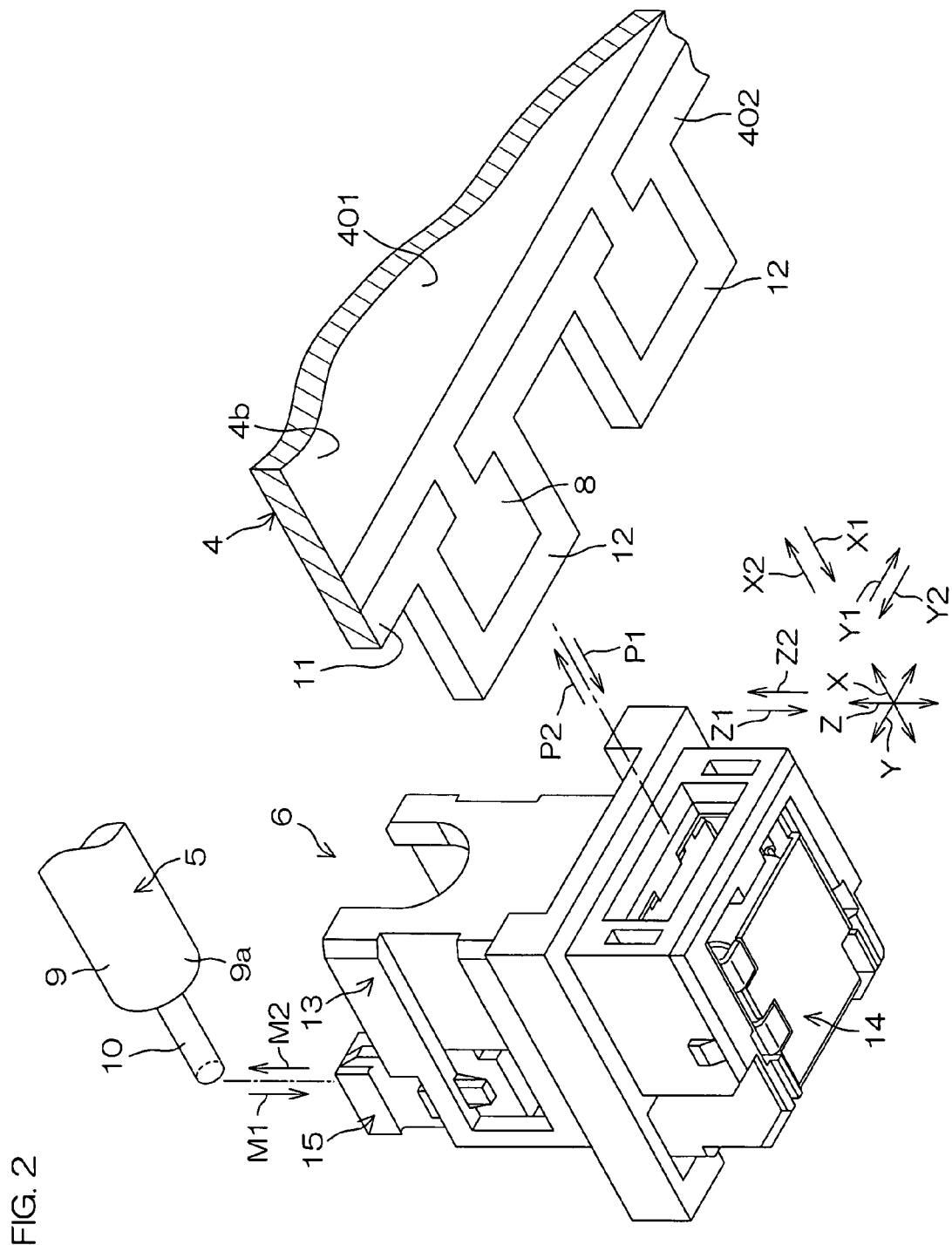
FIG. 2 is a perspective view showing a main part of a circuit board, a cold-cathode tube and the connector.

FIG. 2 is a perspective view showing a main part of the circuit board 4, the cold-cathode tube 5 and the connector 6. Referring to FIG. 2, descriptions are given assuming that a direction being parallel with the left-right direction of the housing 2 is X-direction X, that a direction being parallel with the up-and-down direction of the housing 2 is Y-direction Y, and that a direction being parallel with the front-back direction of the housing 2 is Z-direction Z, for the sake of convenience.

In addition, one side of the X-direction X is first X-direction X1, and the other side of the X-direction X is second X-direction X2. Furthermore, one side of the Y-direction Y is first Y-direction Y1, and the other side of the Y-direction Y is second Y-direction Y2. Still further, one side of the Z-direction Z is first Z-direction Z1, and the other side of the Z-direction Z is second Z-direction Z2.

In addition, when a direction is simply referred to as the X-direction X, the X-direction X is used as a general term indicating the first and second X-directions X1 and X2. Furthermore, when a direction is simply referred to as the Y-direction Y, the Y-direction Y is used as a general term indicating the first and second Y-directions Y1 and Y2. Still further, when a direction is simply referred to as the Z-direction Z, the Z-direction Z is used as a general term indicating the first and second Z-directions Z1 and Z2.

The cold-cathode tube 5 is symmetrical with respect to the X-direction X and includes a cylindrical main portion 9 extending in the X-direction X and a pair of outer leads 10 serving as a pair of terminals provided respectively at a pair of end portions 9a of the main portion 9 (in FIG. 2, only one end portion 9a side is shown).

The main portion 9 is a member made of glass and has a diameter of approximately several to ten-odd mm. The outer lead 10 is a shaft-like conductive member made of a metal such as soft iron and protrudes from the end portion 9a of the main portion 9 in the X-direction X. The diameter of the outer lead 10 is approximately 1 mm, and the length thereof is approximately several mm, for example. The intermediate portion of the main portion 9 in the X-direction X is supported by a support member (not shown).

When the cold-cathode tube 5 is attached to the connector 6 corresponding thereto, the cold-cathode tube 5 is moved in an attachment direction M1 corresponding to the radial direction of the outer lead 10. The attachment direction M1 corresponds to the first Z-direction Z1, for example. In addition, when the cold-cathode tube 5 is detached from the connector 6 corresponding thereto, the cold-cathode tube 5 is moved along a detachment direction M2 being opposite to the attachment direction M1. The detachment direction M2 corresponds to the second Z-direction Z2, for example.

The circuit board 4 includes a rectangular main body portion 401 to which an inverter circuit (not shown) or the like is secured and a plurality of insertion convex portions 12 formed sideways at an edge portion 402 of the main body portion 401 (in FIG. 2, two insertion convex portions 12 are shown).

The edge portion 402 constitutes an end portion 11 of the circuit board 4 on the side of the first X-direction X1. The insertion convex portions 12 are formed sideways in the Y-direction Y so as to correspond to the connectors 6, and the conductive patterns 8 are formed on the back surface 4b.

The insertion convex portion 12 is formed in a rectangular shape. The insertion convex portion 12 is inserted into the corresponding connector 6 along an insertion direction P1. This insertion electrically connects the conductive pattern 8 of the insertion convex portion 12 to the connector 6. The insertion direction P1 corresponds to the first X-direction X1, for example.

The insertion convex portion 12 is extracted from the corresponding connector 6 along an extraction direction P2 that is opposite to the insertion direction P1. This extraction disconnects the electrical connection between the conductive pattern 8 of the insertion convex portion 12 and the corresponding connector 6. The extraction direction P2 corresponds to the second X-direction X2, for example.

A plurality of insertion convex portions 12 are formed similarly also at the edge portion of the circuit board 4 on the side of the second X-direction X2 although they are not shown. The connectors 6 are detachably attached to the insertion convex portions 12. For example, electric power is supplied to the electric connector 6 which is connected to the insertion convex portion 12 of the circuit board 4 on the first X-direction X1 side when a positive voltage is applied by the inverter circuit 7. Electric power is supplied to the electric connector 6 which is connected to the insertion convex portion 12 of the circuit board 4 on the second X-direction X2 side when a negative voltage is applied by the inverter circuit 7.

Since the connectors 6 have the same configuration, one connector 6 will be mainly described below.

The respective dimensions of the connector 6 in the X-direction X, the Y-direction Y and the Z-direction Z are approximately 10 to 15 mm, for example. The connector 6 includes an insulating housing 13, a contact forming member 14 made of a metal and held in this housing 13, and an operation member 15 for operating this contact forming member 14.

Figure 3:
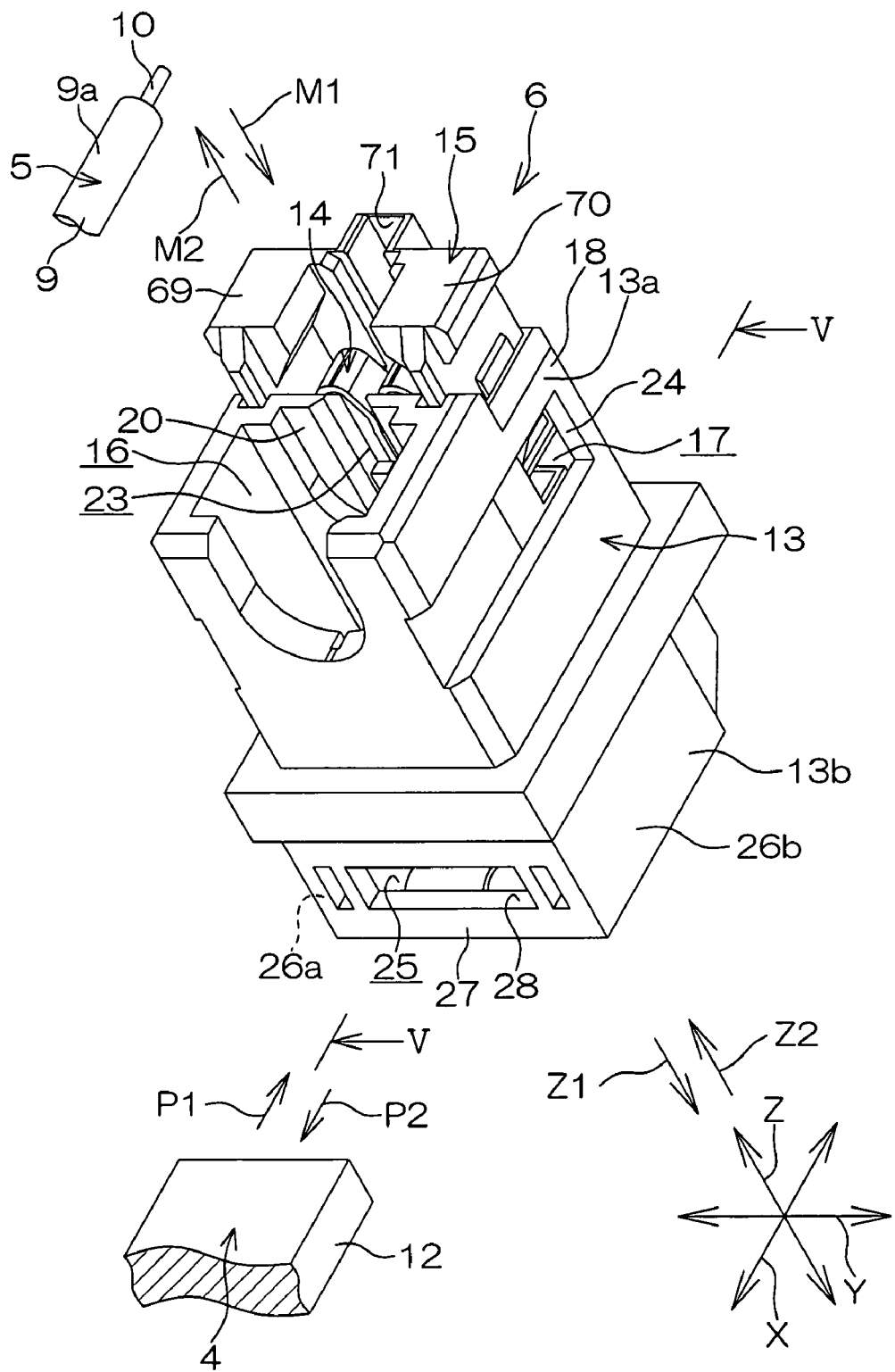
FIG. 3 is a perspective view showing the connector.

FIG. 3 is a perspective view showing the connector 6. Referring to FIG. 3, the housing 13 is generally symmetrical with respect to the Y-direction Y. The housing 13 is an integrally-molded component made of a synthetic resin and has a generally box-like shape. In one end portion 13a of the housing 13 in the Z-direction Z, at a portion close to the cold-cathode tube 5 in the X-direction X, a lead-in cavity 16 is defined. The lead-in cavity 16 is used to introduce the corresponding end portion 9a of the cold-cathode tube 5 into the housing 13.

In the one end portion 13a of the housing 13, at a portion away from the cold-cathode tube 5 in the X-direction X, a receiving cavity 17 is defined. This receiving cavity 17 is for receiving the corresponding outer lead 10 of the cold-cathode tube 5 along the attachment direction M1.

Figure 4:
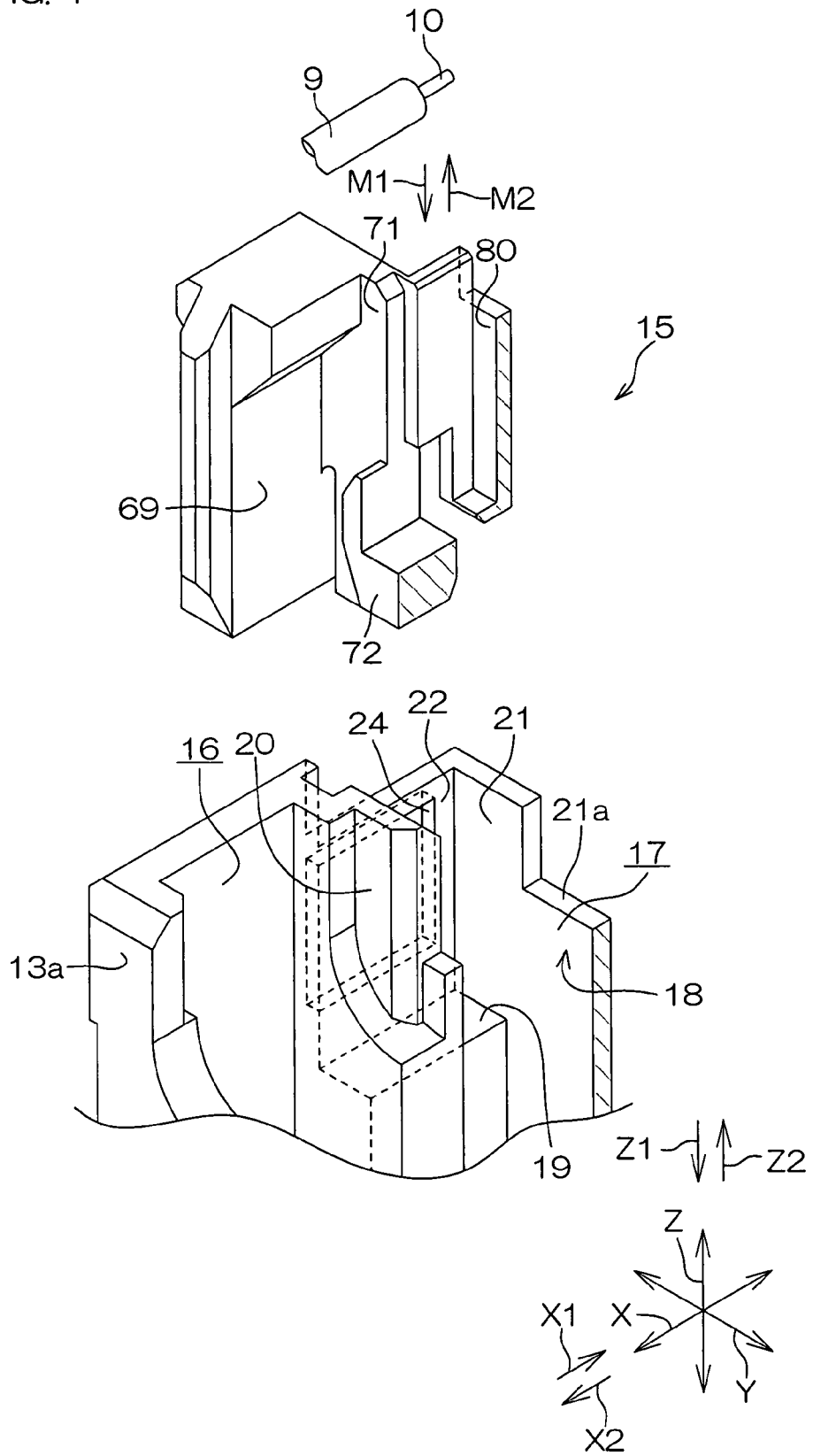
FIG. 4 is a partly sectional perspective view showing one end portion of a housing and a part of an operation member.

FIG. 4 is a partly sectional perspective view showing the one end portion 13a of the housing 13 and the operation member 15. Referring to FIGS. 3 and 4, the receiving cavity 17 is defined by a peripheral wall 18 and a bottom wall 19.

The peripheral wall 18 includes first and second side portions 20 and 21 being opposed to each other in the X-direction X and a pair of third side portions 22 being opposed to each other in the Y-direction Y.

The first side portion 20 partitions the space between the lead-in cavity 16 and the receiving cavity 17. The intermediate portion of the first side portion 20 in the Y-direction Y is notched to form an insertion port 23. The insertion port 23 is open in the detachment direction M2 and can allow the corresponding outer lead 10 to be inserted through.

A concave portion 21a being open in the second Z-direction Z2 is formed in the second side portion 21 so that part of the operation member 15 can be introduced.

Through holes 24 are formed in the respective third side portions 22 (only one through hole 24 is shown in each of FIGS. 3 and 4). The bottom wall 19 continues to the first to third side portions 20, 21 and 22 so that the bottom of the receiving cavity 17 is defined.

Figure 5:
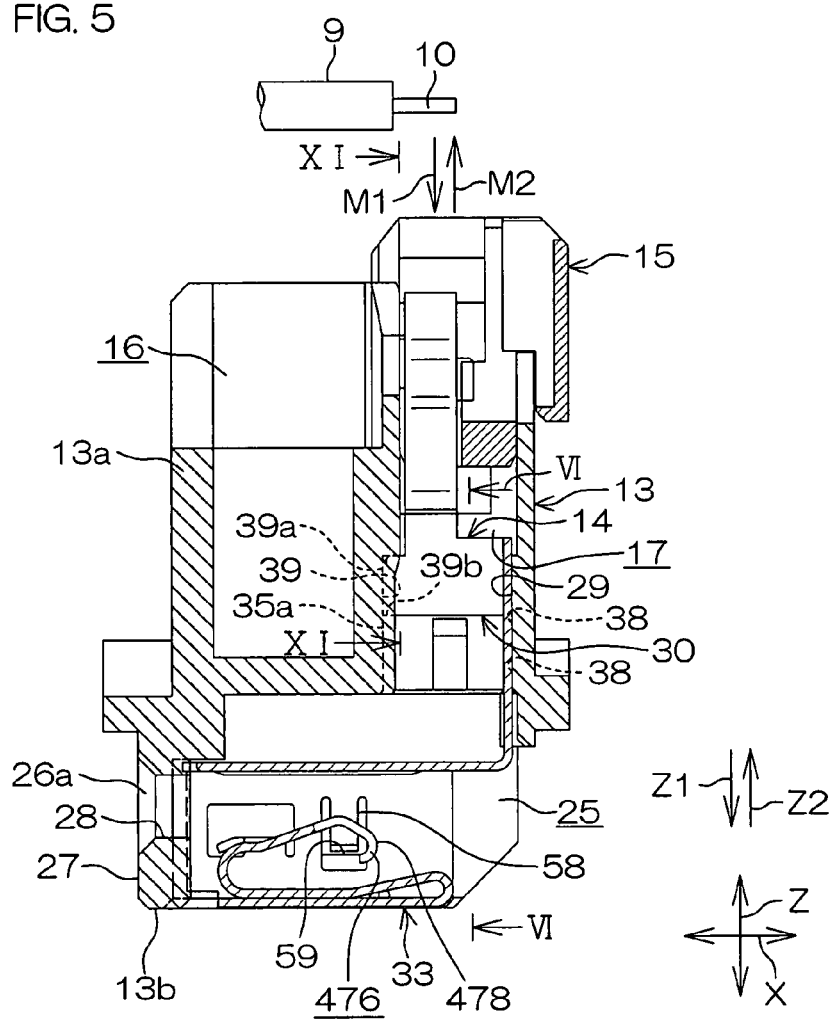
FIG. 5 is a longitudinal sectional view taken along the line V-V of FIG. 3.

FIG. 5 is a longitudinal sectional view taken along the line V-V of FIG. 3. Referring to FIGS. 3 and 5, an accommodating space 25 is defined in the other end portion 13b on the opposite side of the one end portion 13a of the housing 13. The accommodating space 25 is for accommodating the box-like portion 33 of the contact forming member 14, the box-like portion 33 being described later. The accommodating space 25 is defined by a pair of side walls 26a and 26b being opposed to each other in the Y-direction Y and a front wall 27 for connecting one end portions of the side walls 26a and 26b in the X-direction X. An insertion hole 28 into which the insertion convex portion 12 of the circuit board 4 is inserted is formed in the front wall 27.

Figure 6:
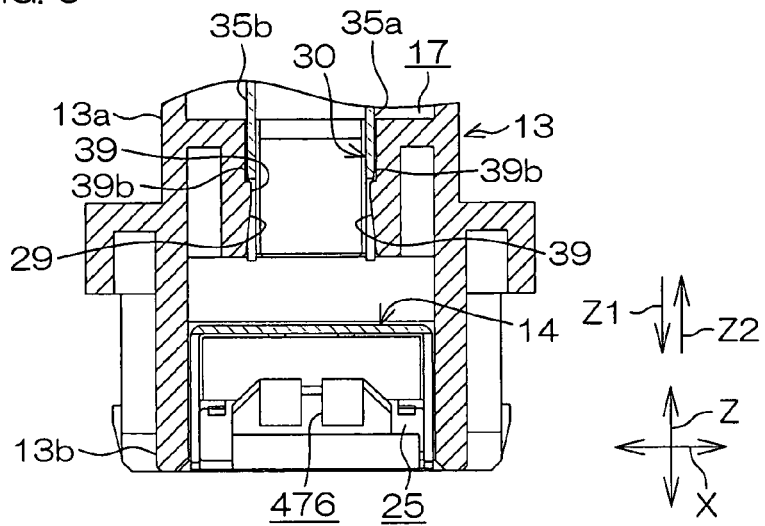
FIG. 6 is a sectional view taken along the line VI-VI of FIG. 5.

FIG. 6 is a sectional view taken along the line VI-VI of FIG. 5. Referring to FIGS. 5 and 6, a communicating hole 29 is formed in the housing 13. The communicating hole 29 passes through between the one end portion 13a and the other end portion 13b of the housing 13, so that the accommodating space 25 communicates with the receiving cavity 17. The communicating hole 29 extends a long distance in the Z-direction Z. A main body portion 30 of the contact forming member 14 is inserted into the communicating hole 29, the main body portion 30 being described later.

Figure 7:
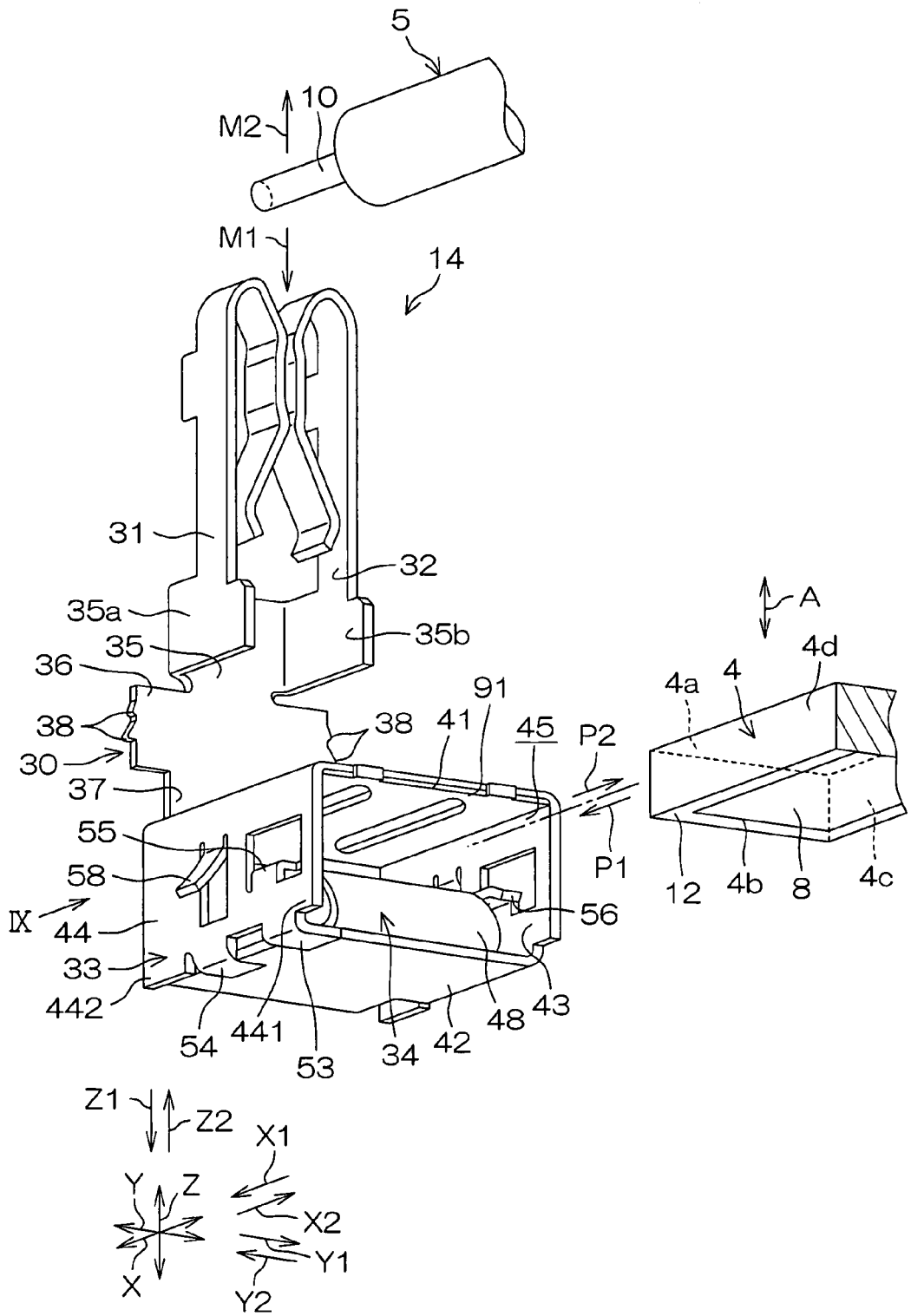
FIG. 7 is a perspective view showing a contact forming member.

FIG. 7 is a perspective view showing the contact forming member 14. Referring to FIG. 7, the contact forming member 14 is electrically connected to the corresponding outer lead 10 of the cold-cathode tube 5 and also electrically connected to the conductive pattern 8 of the circuit board 4. As a result, electrical connection is established between the outer lead 10 and the conductive pattern 8.

A single plate member made of a conductive material such as a metal can be taken as an example of a material of the contact forming member 14. The thickness of this plate member is approximately 0.2 mm, for example. Each of the front and back surfaces of the plate member are plated, and plated layers are formed thereon.

The contact forming member 14 is generally symmetrical with respect to the Y-direction Y. The contact forming member 14 includes the main body portion 30, a pair of first elastic piece portions 31 and 32 extended from the main body portion 30 to serve as fluorescent tube connecting contacts, the box-like portion 33 extended from the main body portion 30, and a circuit board connecting contact 34 provided inside the box-like portion 33 to serve as a connection member connecting contact.

The main body portion 30 includes an upper portion 35 for connecting the pair of first elastic piece portions 31 and 32, an intermediate portion 36 positioned on the side of the first Z-direction Z1 with respect to the upper portion 35, and a lower portion 37 positioned on the side of the first Z-direction Z1 with respect to the intermediate portion 36.

The upper portion 35 is U-shaped as viewed along the Z-direction Z, and the first elastic piece portions 31 and 32 are respectively connected to a pair of portions 35a and 35b being opposed to each other in the Y-direction Y.

The intermediate portion 36 is formed to be longer than the upper portion 35 in the Y-direction Y. An engaging convex portion 38 for frictionally engaging with the housing 13 is provided on each of a pair of end portions of the intermediate portion 36 with respect to the Y-direction Y.

Referring to FIGS. 5 and 6, the main body portion 30 is held in the housing 13. More specifically, the main body portion 30 is inserted through the communicating hole 29 of the housing 13. In addition, the engaging convex portions 38 of the main body portion 30 respectively make frictional contact with the mutually opposed portions on the peripheral surface of the communicating hole 29.

On the peripheral surface of the communicating hole 29, a pair of rails 39 aligned in the Y-direction Y is formed to extend in the Z-direction Z. In these rails 39, the corresponding portions 35a and 35b of the upper portion 35 are respectively fitted.

Step portions 39a are formed at the end portions of the rails 39 on the side of the second Z-direction Z2. The corresponding portions 35a and 35b of the pair of portions 35a and 35b are respectively received by the step portions 39a. Hence, the main body portion 30 is restricted from moving in the second Z-direction Z2. In addition, engaging convex portions 39b are formed on the rails 39 to receive the end edges of the portions 35a and 35b on the side of the first X-direction X1. With this configuration, the main body portion 30 is restricted from moving in the first Z-direction Z1.

Referring to FIG. 7, one of the features of this embodiment is that the circuit board connecting contact 34 is extended from the box-like portion 33 and the circuit board connecting contact 34 is disposed inside the box-like portion 33.

The box-like portion 33 includes four walls: a first wall 41, a second wall 42, a third wall 43 and a fourth wall 44. The first to fourth walls 41 to 44 are each formed in a rectangular flat plate. These first to fourth walls 41 to 44 are formed as a whole in a cylindrical shape having a rectangular portion.

The first and second walls 41 and 42 are opposed to each other in the Z-direction Z and extend generally parallel with each other. The first and second walls 41 and 42 are configured so that they can be respectively opposed to the front surface 4a and the back surface 4b of the insertion convex portion 12 (the circuit board 4).

Figure 8:
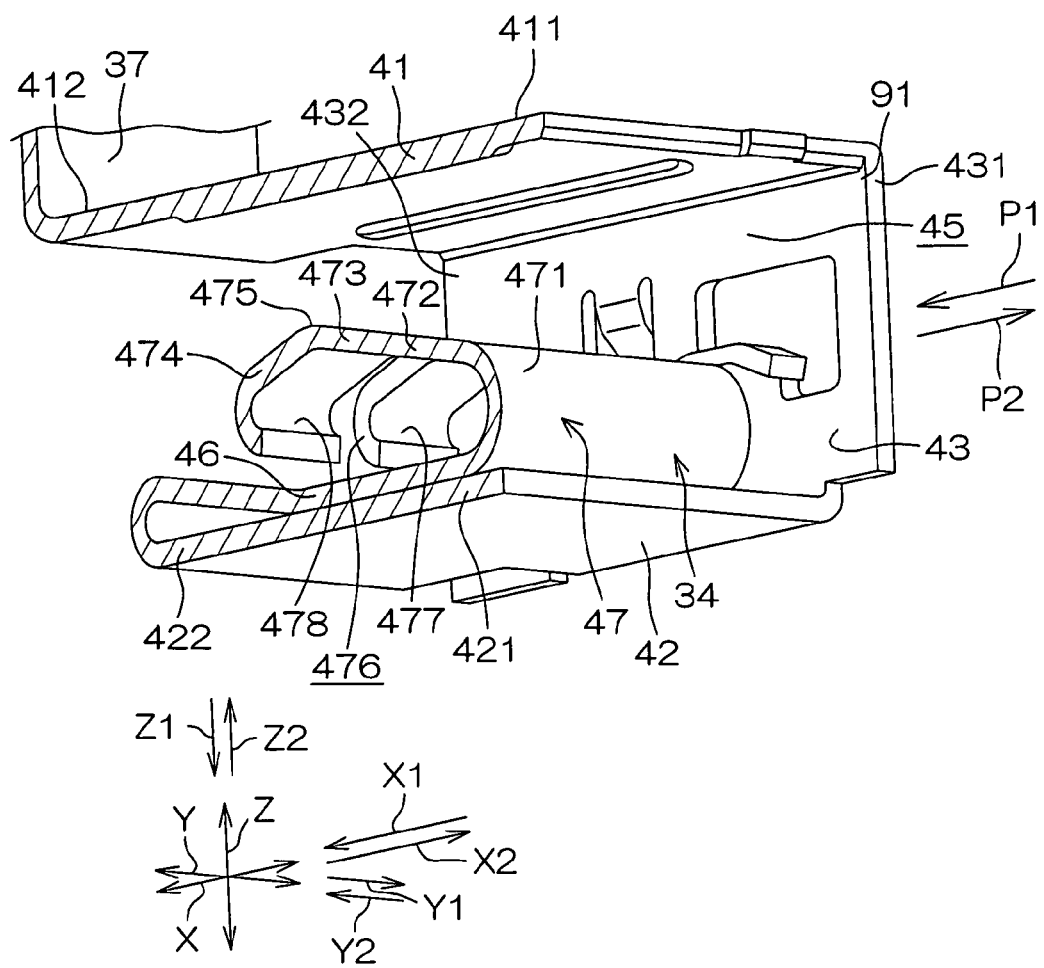
FIG. 8 is a perspective sectional view showing a main part shown in FIG. 7.

FIG. 8 is a perspective sectional view showing a main part shown in FIG. 7. Referring to FIGS. 7 and 8, the third and fourth walls 43 and 44 are opposed to each other in the Y-direction Y and extend generally parallel with each other. The third and fourth walls 43 and 44 are generally orthogonal to both the first and second walls 41 and 42. The third and fourth walls 43 and 44 can be opposed to a pair of side edges 4c and 4d of the insertion convex portion 12, the side edges 4c and 4d being opposed to each other in the Y-direction Y.

An insertion concave portion 45 (insertion space) is defined by the above-mentioned first to fourth walls 41 to 44. The insertion convex portion 12 can be inserted into the corresponding insertion concave portion 45 by moving the insertion convex portion 12 to the corresponding insertion concave portion 45 in the insertion direction P1.

Furthermore, the insertion convex portion 12 can be extracted from the corresponding insertion concave portion 45 by moving the insertion convex portion 12 from the corresponding insertion concave portion 45 in the extraction direction P2 that is opposite to the insertion direction P1.

The first wall 41 extends from the lower portion 37 of the main body portion 30 and extends along the second X-direction X2.

From a tip end of the first wall 41 in the first Y-direction Y1, the third wall 43 extends in the first Z-direction Z1. From a tip end of the third wall 43 in the first Z-direction Z1, the second wall 42 extends in the second Y-direction Y2. From a tip end of the first wall 41 in the second Y-direction Y2, the fourth wall 44 extends in the first Z-direction Z1.

The first to fourth walls 41 to 44 respectively have first end portions 411, 421, 431 and 441 being relatively close to an entrance 91 of the insertion concave portion 45, and also respectively have second end portions 412, 422, 432 and 442 being relatively away from the entrance 91 of the insertion concave portion 45.

The first end portions 411, 421, 431 and 441 are end portions on the side of the entrance 91 for insertion of the insertion convex portion 12. The second end portions 412, 422, 432 and 442 are end portions on the opposite side of the entrance 91 for insertion of the insertion convex portion 12.

The circuit board connecting contact 34 extends from at least one of the four walls 41 to 44 of the box-like portion 33. In this embodiment, the circuit board connecting contact 34 extends from the second end portion 422 of the second wall 42.

The circuit board connecting contact 34 is formed in a slender plate-like shape. The circuit board connecting contact 34 makes elastic contact with the conductive pattern 8 of the insertion convex portion 12 inserted into the corresponding insertion concave portion 45, thereby being electrically connected to the conductive pattern 8.

The circuit board connecting contact 34 includes a fixed piece portion 46 extended from the second end portion 422 of the second wall 42 and an elastic piece portion 47 extended from the tip portion of the fixed piece portion 46 and bent into a U-shape.

The fixed piece portion 46 is bent back so that at least part thereof makes close contact with the second wall 42 from which the circuit board connecting contact 34 is extended. Part of the base end portion side of the fixed piece portion 46, the side being connected to the second wall 42, slightly floats from the second end portion 422. The intermediate portion of the fixed piece portion 46 makes close contact with the second wall 42 and extends in the second X-direction X2.

The elastic piece portion 47 is an elastic piece portion of the so-called curled spring type that is smoothly curved as a whole. The elastic piece portion 47 extends from the tip end portion of the fixed piece portion 46, is bent back in a U-shape, and further extends in the insertion direction P1. The elastic piece portion 47 can be bent while the tip end portion of the fixed piece portion 46 is used as a fulcrum.

The elastic piece portion 47 includes a curved portion 471 curled so as to be convex toward the extraction direction P2 and a main body portion 472 extending from the curved portion 471 along the insertion direction P1.

The base end portion of the curved portion 471 continues to the tip end portion of the fixed piece portion 46 and is supported by the first end portion 421 of the second wall 42. The tip end of the curved portion 471 is directed in the first X-direction X1 and connected to the main body portion 472.

The main body portion 472 includes a first inclined portion 473 that is inclined so as to be farther from the second wall 42 in the insertion direction P1, and a second inclined portion 474 that is extended from the first inclined portion 473 and is inclined so as to be closer to the second wall 42 in the insertion direction P1.

Figure 9:
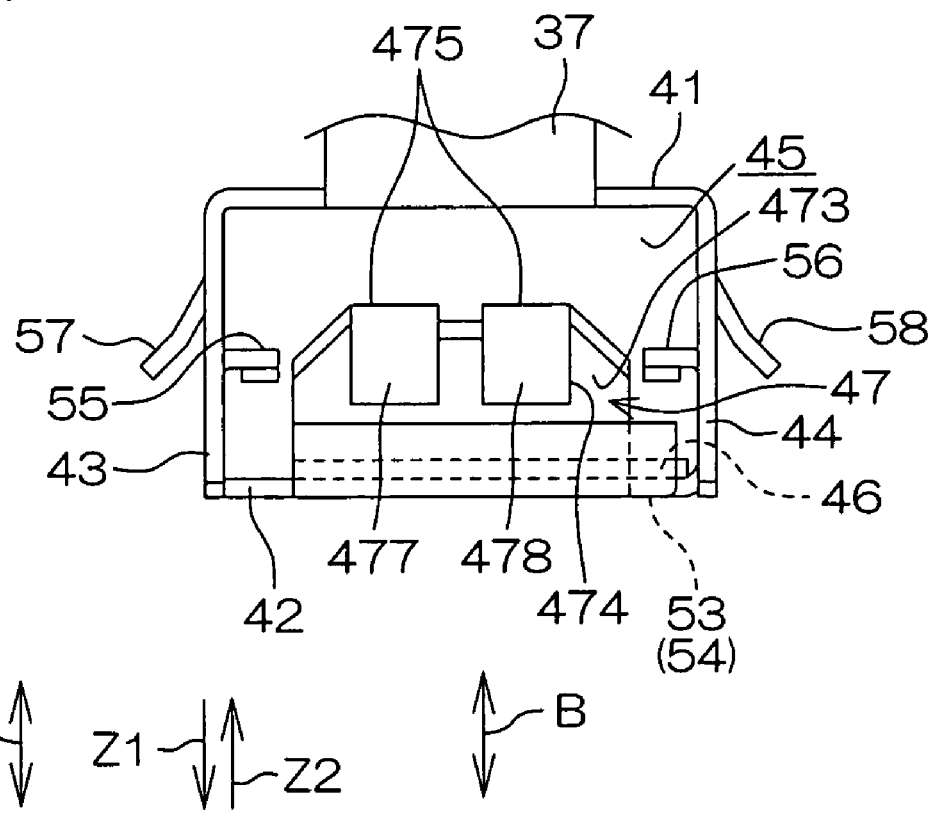
FIG. 9 is a side view showing a box-like portion viewed along the arrow direction IX of FIG. 7.

FIG. 9 is a side view showing the box-like portion 33 viewed along the arrow direction IX of FIG. 7. Referring to FIGS. 8 and 9, the lateral width of the first inclined portion 473 becomes narrower in the insertion direction P1. The tip end of the first inclined portion 473 is the highest portion of the elastic piece portion 47 from the second wall 42. A contact portion 475 is provided at the tip end of the first inclined portion 473. When the insertion convex portion is inserted into the insertion concave portion 45, the contact portion 475 makes contact with the conductive pattern of the insertion convex portion to establish electrical connection therewith.

The second inclined portion 474 is extended from the tip end of the first inclined portion 473. The boundary portion of the first and second inclined portions 473 and 474 has a raised shape curved smoothly. The tip end of the second inclined portion 474 is curled with respect to the intermediate portion of the second inclined portion 474. With this configuration, when the tip end of the second inclined portion 474 makes contact with the fixed piece portion 46, the second inclined portion 474 is prevented from scratching the fixed piece portion 46.

Referring to FIGS. 5 and 8, the elastic piece portion 47 includes a pair of portions 477 and 478 defined by a slit 476 extending in the insertion direction P1. The pair of portions 477 and 478 includes part of the first inclined portion 473 on the tip end side and the second inclined portion 474.

The slit 476 is positioned at a generally central position in the width direction of the elastic piece portion 47. The pair of portions 477 and 478 can be elastically deformed independently of each other. The tip ends of the pair of portions 477 and 478 constitute the tip end of the elastic piece portion 47.

When the elastic piece portion 47 is bent, the tip ends of the one portion 477 and the other portion 478 are indirectly received by the second wall 42 via the fixed piece portion 46.

Referring to FIGS. 7 and 9, restricting piece portions 53 and 54 are provided to restrict the fourth wall 44 from moving in the second Z-direction Z2 with respect to the second wall 42. The restricting piece portions 53 and 54 are aligned with a clearance provided therebetween in the X-direction X and protrude from the tip end of the fourth wall 44 with respect to the first Z-direction Z1. The restricting piece portions 53 and 54 are generally orthogonal to the fourth wall 44 and make contact with the fixed piece portion 46 from the first Z-direction Z1 side.

With this configuration, when the elastic piece portion 47 makes contact with the insertion convex portion 12 of the circuit board 4 at a predetermined contact pressure, the reaction force applied to the insertion convex portion 12 is transmitted to the restricting piece portions 53 and 54 via the first wall 41 and the fourth wall 44 and received by the fixed piece portion 46.

Guide protrusions 55 and 56 are formed on the third and fourth walls 43 and 44, respectively. These guide protrusions 55 and 56 restrict the bending of the elastic piece portion 47 by guiding the insertion of the insertion convex portion 12 into the insertion concave portion 45.

The guide protrusions 55 and 56 are small pieces formed by bending parts of the corresponding third and fourth walls 43 and 44 toward the insertion concave portion 45 side, respectively. The guide protrusions 55 and 56 extend so as to be long in the insertion direction P1. When the elastic piece portion 47 is in a free state (a state with no external force applied), the guide protrusions 55 and 56 are generally aligned with the tip end of the curved portion 471 in an opposed direction B in which the first and second walls 41 and 42 are opposed to each other. The guide protrusions 55 and 56 are closer to the first wall 41 than the tip end of the curved portion 471 does.

The end portions of the guide protrusions 55 and 56 on the upstream sides thereof in the insertion direction P1 are bent so as to be away from the first wall 41, so that the distance from the first wall 41 is larger. With this configuration, the insertion convex portion 12 can be inserted easily into the space between the guide protrusions 55 and 56 and the first wall 41.

In addition, engaging protrusions 57 and 58 are provided on the third and fourth walls 43 and 44, respectively, to prevent disengagement from the housing. The engaging protrusions 57 and 58 are small pieces respectively protruding from the corresponding third and fourth walls 43 and 44 to the sides opposite to the insertion concave portion 45, and extend in the first Z-direction Z1.

Referring to FIG. 5, the engaging protrusion 57 is engaged with an engaging concave portion 59 formed on the side wall 26a of the housing 13, thereby restricting the engaging protrusion 57 from moving toward the housing 13 in the second Z-direction Z2. The engaging protrusion 58 is also engaged with an engaging concave portion 59 formed on the side wall 26b in a similar way although the engagement is not shown.

Figure 10:
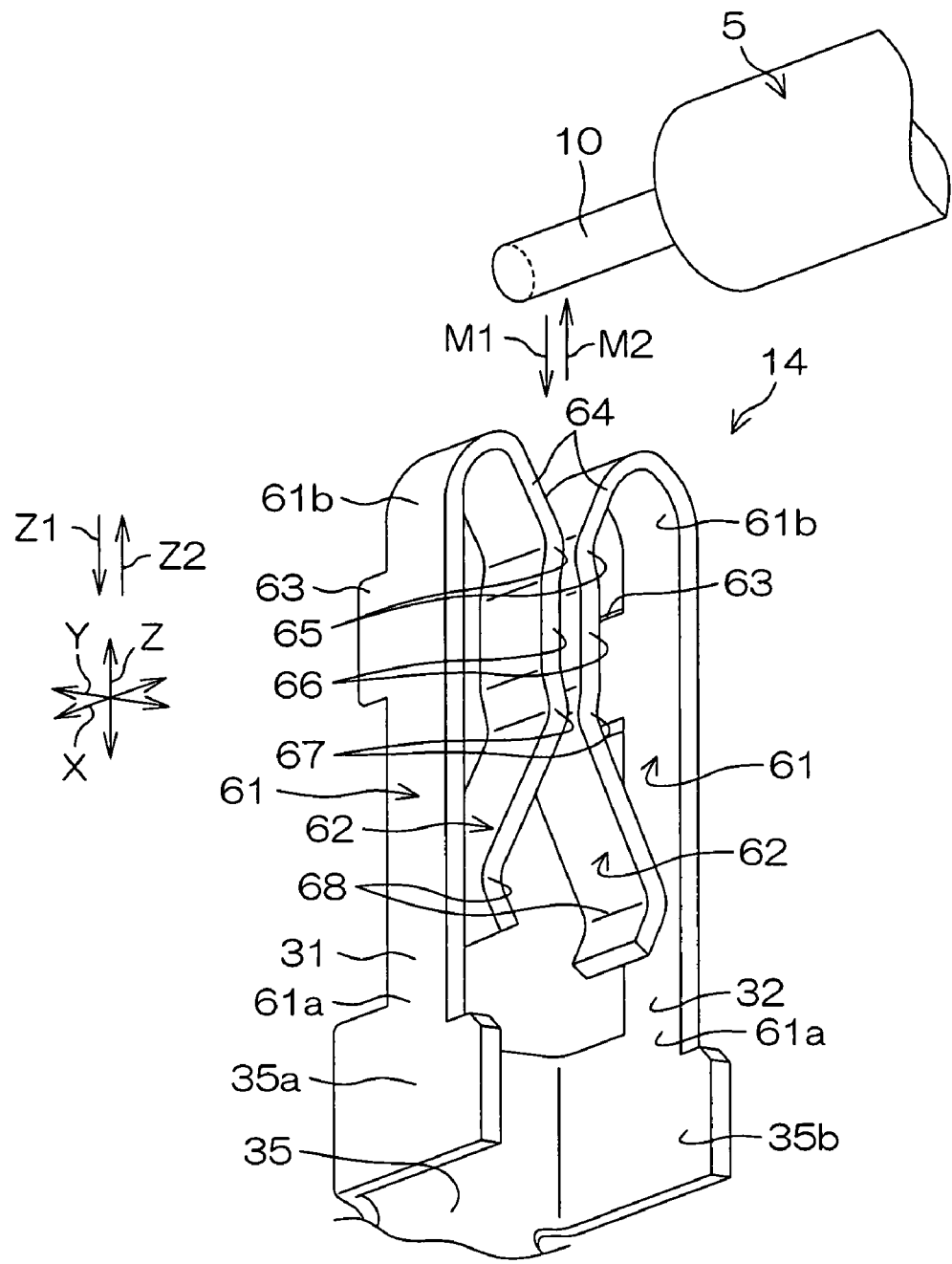
FIG. 10 is an enlarged view showing a pair of first elastic piece portions.
Figure 11:
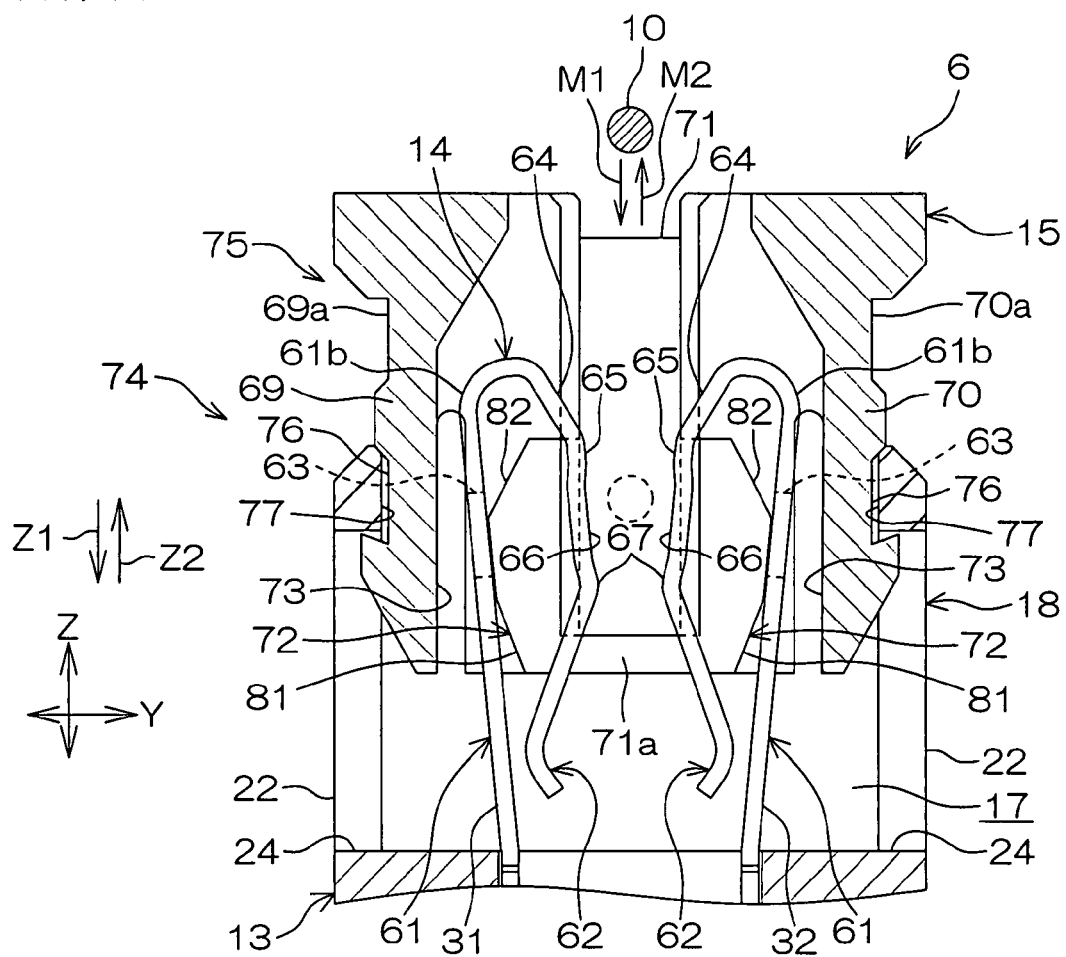
FIG. 11 is a sectional view showing a main part taken along the line XI-XI of FIG. 5, showing a state in which no outer lead is connected to the contact forming member.

FIG. 10 is an enlarged view showing the pair of first elastic piece portions 31 and 32. FIG. 11 is a sectional view showing a main part taken along the line XI-XI of FIG. 5, showing a state in which the outer lead 10 is not connected to the contact forming member 14.

Referring to FIGS. 10 and 11, the pair of first elastic piece portions 31 and 32 is attached so as to make elastic contact with the outer lead 10 of the corresponding cold-cathode tube 5, thereby being electrically connected to the outer lead 10.

The pair of first elastic piece portions 31 and 32 has shapes being symmetrical with respect to the Y-direction Y. The first elastic piece portions 31 and 32 are extended from the corresponding portions 35a and 35b of the upper portion 35 of the main body portion 30, respectively. The pair of first elastic piece portions 31 and 32 are disposed inside the receiving cavity 17 so as to be mutually opposed in the Y-direction Y.

Each of the first elastic piece portions 31 and 32 includes a first piece portion 61 and a second piece portion 62.

The first piece portions 61 extend from the corresponding portions 35a and 35b of the upper portion 35 of the main body portion 30 along the second Z-direction Z2. The second piece portions 62 are bent back from the tip end portion 61b of the corresponding first piece portion 61 and extends along the first Z-direction Z1. The pair of first piece portions 61 are disposed so as to be relatively away from each other in the Y-direction Y and the pair of second piece portions 62 are disposed so as to be relatively close to each other in the Y-direction Y.

The first piece portions 61 can be made close to and away from each other elastically while the base ends 61*a* thereof are used as fulcrums. In a free state (a state with no external force applied), the first piece portions 61 are arranged parallel with each other.

An engaging portion 63 is provided on the tip end portion 61*b* of each first piece portion 61 to engage a widening operation portion 72 described later. The engaging portion 63 is a small piece and protrudes from the tip end portion 61*b* of the corresponding first piece portion 61 in the first X-direction X1.

The second piece portion 62 includes a bent-back portion 64 continuing to the tip end portion 61*b* of the corresponding first piece portion 61, a first narrow portion 65, a straight portion 66 (contact portion) serving as a sandwiching portion for sandwiching the outer lead 10 in its diametric direction, a second narrow portion 67, and a tip end portion 68.

The distance between one side surfaces of the pair of bent-back portions 64, being opposed to each other, is narrower in the attachment direction M1. These one side surfaces of the pair of bent-back portions 64, being opposed to each other, serve as guide portions for guiding the installation of the outer lead 10.

The pair of first narrow portions 65 serves to prevent the corresponding outer lead 10 from coming out from the pair of straight portions 66 in the detachment direction M2 and continues to the pair of bent-back portions 64.

The distance between the pair of first narrow portions 65 is made narrower than the distance between the pair of bent-back portions 64 and is also made narrower than the distance between the pair of straight portions 66. When the pair of first elastic piece portions 31 and 32 become close to each other, the distance between the pair of first narrow portions 65 becomes narrower than the diameter of the outer lead 10.

The pair of straight portions 66 allows the outer lead 10 to move relatively in the attachment direction M1 while establishing electrical connection with the corresponding outer lead 10. Each of the straight portions 66 continues to the corresponding first narrow portion 65 and extends along the attachment direction M1 when it is in a free state.

The pair of second narrow portions 67 is used to prevent the corresponding outer lead 10 from coming out from the pair of straight portions 66 in the attachment direction M1. The pair of second narrow portions 67 respectively continue to the corresponding straight portions 66.

The distance between the pair of second narrow portions 67 is made narrower than the distance between the pair of straight portions 66. When the pair of first elastic piece portions 31 and 32 become close to each other, the distance between the pair of second narrow portions 67 becomes narrower than the diameter of the outer lead 10.

The pair of tip end portions 68 continue to the corresponding second narrow portions 67. When pushed by the corresponding first piece portions 61, the pair of tip end portions 68 make the distance between the pair of the straight portions 66 narrower.

The pair of tip end portions 68 has a shape being wider in the Y-direction Y when viewed along the X-direction X. The distance between the pair of tip end portions 68 becomes larger in the first Z-direction Z1. The tip ends of the tip end portions 68 in the first Z-direction Z1 are bent so as to be close to each other, so that the tip ends can smoothly engage with the corresponding first piece portions 61.

Referring to FIGS. 3 and 11, the operation member 15 performs operation to sandwich the outer lead 10 between the pair of straight portions 66 and to release the sandwiching. The operation member 15 is fitted in the receiving cavity 17 of the housing 13 and can be moved relatively in the first and second Z-directions Z1 and Z2 (the attachment direction M1 and the detachment direction M2).

The operation member 15 is a molded component made of a synthetic resin and is symmetrical with respect to the Y-direction Y. The operation member 15 has a pair of portions 69 and 70 being opposed to each other with a distance provided therebetween in the Y-direction Y, a linking portion 71 for linking the pair of portions 69 and 70, and a pair of the widening operation portions 72 provided on the linking portion 71.

The pair of portions 69 and 70 is disposed so as to sandwich the pair of first elastic piece portions 31 and 32 inside the receiving cavity 17. The pair of portions 69 and 70 is sandwiched between pair of the third side portions 22 of the peripheral walls 18.

Cutouts 73 being open in the second Z-direction Z2 are formed between the one portion 69 and the linking portion 71 and between the other portion 70 and the linking portion 71. The cutouts 73 allow the pair of portions 69 and 70 to bend easily. With this configuration, the operation member 15 can be inserted easily into the receiving cavity 17.

The connector 6 is provided with first and second holding mechanisms 74 and 75. The first holding mechanism 74 is for holding the operation member 15 at a widening position (see FIG. 11). The widening position is the position when the operation member 15 relatively widens the distance between the pair of first elastic piece portions 31 and 32.

Furthermore, it is possible to say that the widening position is a position at which the distance between the pair of straight portions 66 is widened by the widening operation portions 72 of the operation member 15 so that the outer lead 10 can be inserted between the pair of straight portions 66 without insertion force (with zero insertion force).

The first holding mechanism 74 includes first groove portions 76 formed respectively on outside surfaces 69*a* and 70*a* of the pair of portions 69 and 70 of the operation member 15, and engaging portions 77 provided respectively on the pair of third side portion 22 of the peripheral wall 18 to engage the corresponding first groove portions 76.

The engaging portions 77 are respectively formed on the pair of third side portion 22 of the peripheral wall 18 and fitted in the first groove portions 76 at the widening position.

Figure 12:
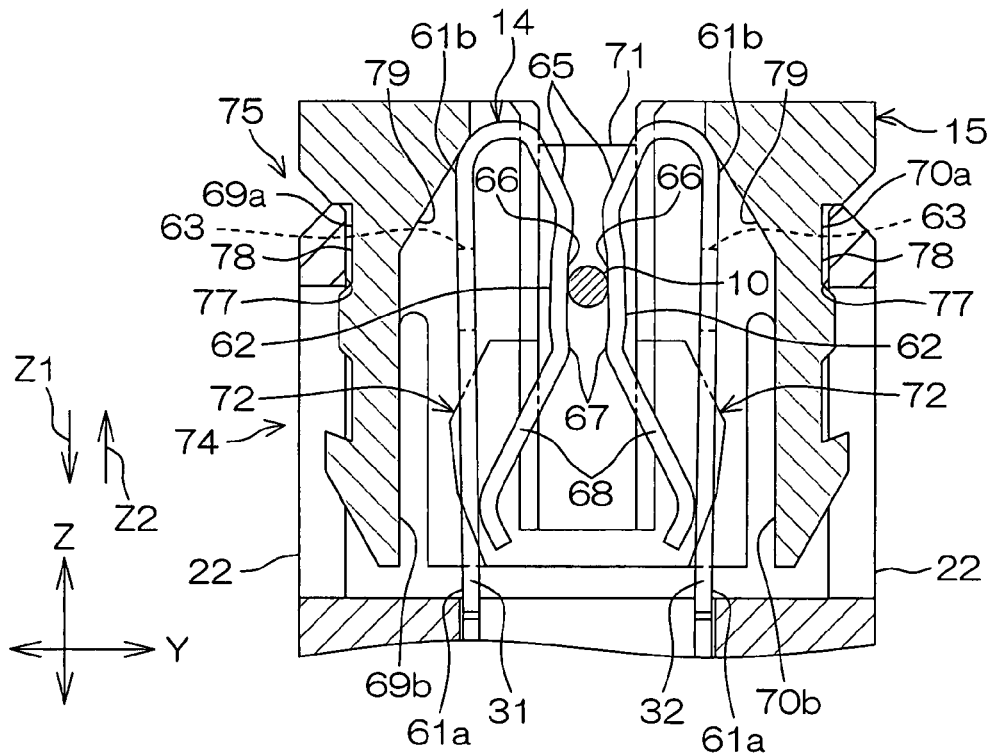
FIG. 12 is a sectional view showing a state in which an outer lead is connected to the contact forming member.

FIG. 12 is a sectional view showing a state in which the outer lead 10 is connected to the contact forming member 14. Referring to FIG. 12, the second holding mechanism 75 is for holding the operation member 15 at a widening release position. The widening release position is a position when the operation member 15 relatively narrows the distance between the pair of first elastic piece portions 31 and 32.

The second holding mechanism 75 includes second groove portions 78 formed respectively on the outside surfaces 69*a* and 70*a* of the pair of portions 69 and 70 of the operation member 15, and engaging portions 77 provided respectively on the pair of third side portion 22 of the peripheral wall 18 to engage the corresponding second groove portions 78.

When the operation member 15 is located at the widening release position, the engaging portions 77 are fitted in the second groove portions 78. The engaging portions 77 constitute part of the first holding mechanism 74 and also constitute part of the second holding mechanism 75.

Inside surfaces 69*b* and 70*b* of the pair of portions 69 and 70 are opposed to each other with the pair of first elastic piece portions 31 and 32 sandwiched therebetween. The tip ends of the pair of inside surfaces 69b and 70b in the second Z-direction Z2 serve as inclined cam surfaces. The distance between these inclined cam surfaces becomes narrower in the second Z-direction Z2.

The inclined cam surfaces are used as pressure application portions 79. The pair of pressure application portions 79 can apply pressure to the tip end portions 61b of the corresponding first piece portions 61 of the pair of first elastic piece portions 31 and 32.

When the operation member 15 is located at the widening release position, the pair of pressure application portions 79 applies pressure to the corresponding tip end portions 61b. Hence, the distance between the pair of straight portions 66 narrows, and the force for sandwiching the outer lead 10 by the pair of straight portions 66 can be increased. In addition, reduction of the sandwiching force due to fatigue of the pair of first elastic piece portions 31 and 32 can be prevented.

When the operation member 15 is displaced from the widening position (see FIG. 11) to the widening release position (see FIG. 12) along the first Z-direction Z1, the pair of pressure application portions 79 applies pressure to the corresponding tip end portions 61b. By this pressure application, the pair of first elastic piece portions 31 and 32 come close to each other.

Referring to FIGS. 4 and 12, the linking portion 71 links the tip ends of the pair of portions 69 and 70 with respect to the first X-direction X1. A protruding portion 80 protruding from the receiving cavity 17 in the first X-direction X1 is formed on the linking portion 71. This protruding portion 80 is received by the concave portion 21a of the peripheral wall 18 at the widening release position.

Referring to FIG. 11, the pair of widening operation portions 72 engage the corresponding engaging portions 63 of the pair of first elastic piece portions 31 and 32, respectively, thereby widening the distance between the pair of straight portions 66. The pair of widening operation portions 72 protrude from the inside surface 71a of the linking portion 71 toward the pair of first elastic piece portions 31 and 32 side (on the front side of the face of the paper).

Each of the pair of widening operation portions 72 has a first inclined cam surface 81 provided at the tip end thereof in the first Z-direction Z1 and a second inclined cam surface 82 provided at the tip end in the second Z-direction Z2.

The pair of first inclined cam surfaces 81 is used to widen the distance between the pair of engaging portions 63 when the operation member 15 is fitted in the receiving cavity 17 along the first Z-direction Z1. The distance between the pair of first inclined cam surfaces 81 becomes narrower in the first Z-direction Z1.

The pair of first inclined cam surfaces 81 makes contact with the corresponding engaging portions 63 when the operation member 15 is displaced in the first Z-direction Z1, thereby widening the distance between the pair of engaging portions 63.

When the operation member 15 is displaced from the widening release position (see FIG. 12) to the widening position (see FIG. 11), the pair of second inclined cam surfaces 82 makes contact with the corresponding engaging portions 63. Hence, the pair of second inclined cam surfaces 82 widens the distance between the pair of engaging portions 63. The distance between the pair of second inclined cam surfaces 82 becomes narrower in the second Z-direction Z2.

Figure 13:
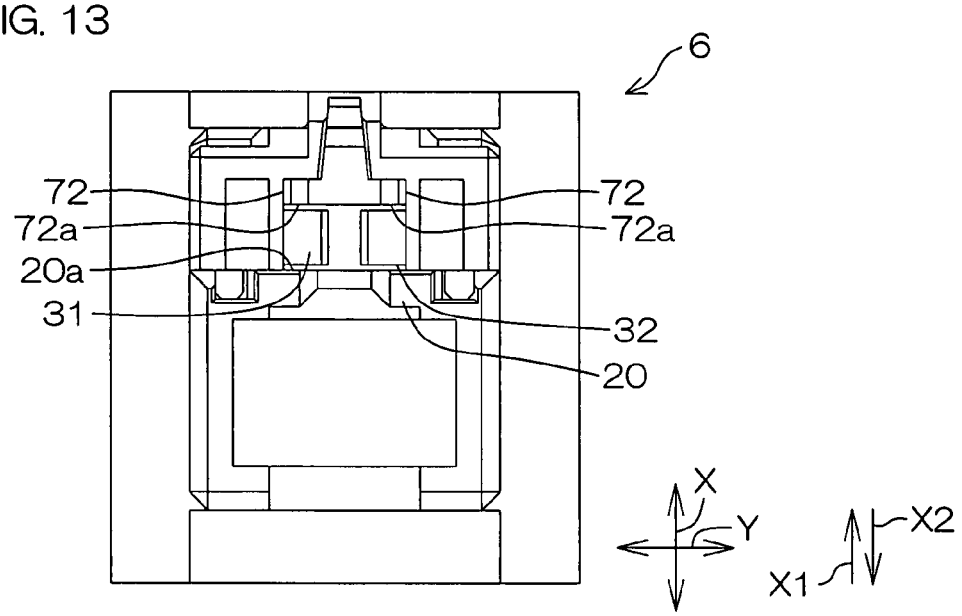
FIG. 13 is a plan view showing the connector viewed along first Z-direction.

FIG. 13 is a plan view showing the connector 6 viewed along the first Z-direction Z1. Referring to FIG. 13, one side surfaces 72a of the widening operation portions 72, facing the second X-direction X2, are opposed to the corresponding first elastic piece portions 31 and 32. These one side surfaces 72a serve as restricting portions for restricting the corresponding first elastic piece portions 31 and 32 from being displaced in the first X-direction X1.

In the first side portion 20 of the peripheral wall 18, one side surface 20a facing the first X-direction X1 is opposed to the first elastic piece portions 31 and 32. The one side surface 20a serves as a restricting portion for restricting the first elastic piece portions 31 and 32 from being displaced in the second X-direction X2.

Figure 14A:
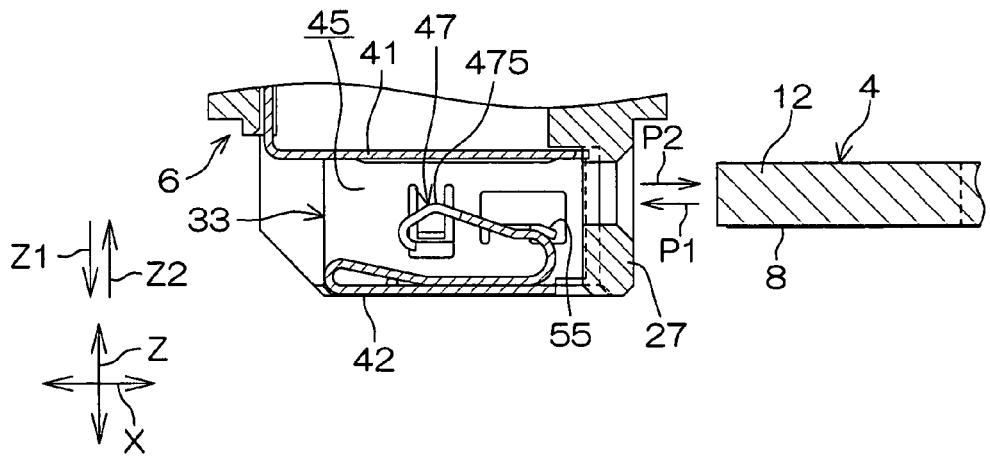
FIGS. 14A, 14B and 14C are sectional views showing a main part, illustrating the connection between the connector and the circuit board.

In the liquid crystal display device having the general configuration described above, the outer lead of the cold-cathode tube is electrically connected to the conductive pattern of the circuit board as described below. That is, first, the insertion concave portion 45 of the connector 6 is opposed to the insertion convex portion 12 of the circuit board 4 in the X-direction X as shown in FIG. 14A. Next, the insertion convex portion 12 is moved relatively to the insertion concave portion 45 side along the insertion direction P1.

Figure 14B:
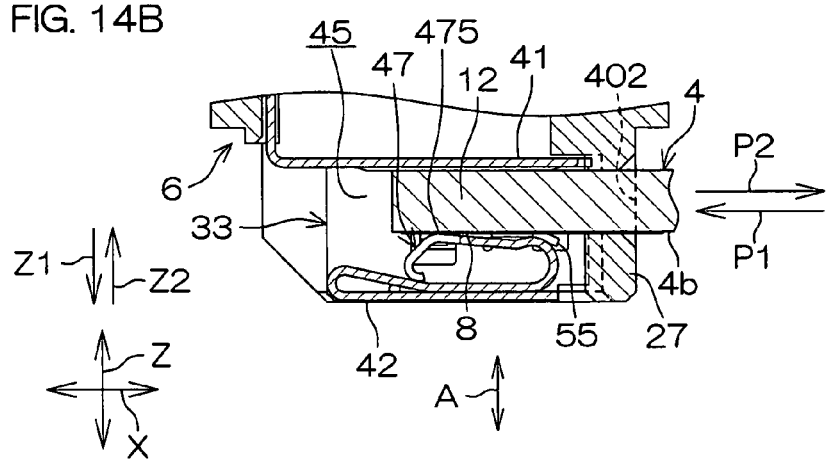

As a result, the insertion convex portion 12 of the circuit board 4 is slid and inserted into the insertion concave portion 45 of the connector 6 as shown in FIG. 14B. The contact portion 47b of the elastic piece portion 47 makes elastic contact with the conductive pattern 8 of the insertion convex portion 12. At this time, the insertion convex portion 12 of the circuit board 4 is sandwiched between the elastic piece portion 47 and the first wall 41.

Figure 14C:
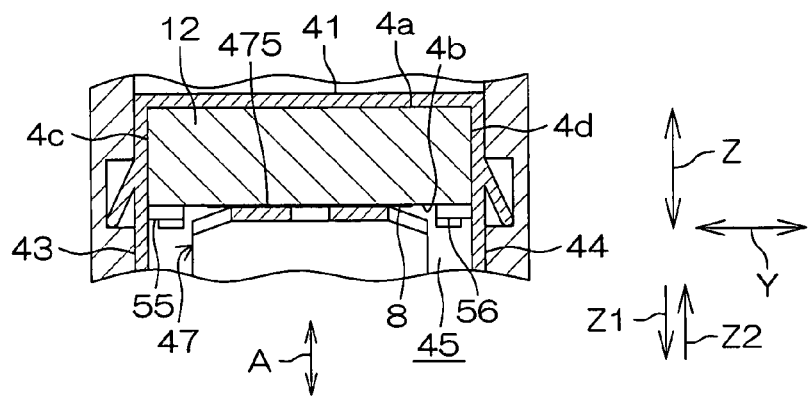

Furthermore, as shown in FIG. 14C, the guide protrusions 55 and 56 receive the back surface 4b of the insertion convex portion 12. At this time, the insertion convex portion 12 is sandwiched between the guide protrusions 55 and 56 and the first wall 41 from which the circuit board connecting contact 34 is not extended. As a result, the insertion convex portion 12 is positioned in a thickness direction A of the insertion convex portion 12.

By the positioning of the insertion convex portion 12 in the thickness direction A thereof, the bending of the elastic piece portion 47 due to the insertion of the insertion convex portion 12 is restricted to a predetermined amount. In other words, the insertion convex portion 12 is restricted from moving to the elastic piece portion 47 side.

Furthermore, the guide protrusions 55 and 56 prevent the insertion convex portion 12 from inclining with respect to the sideways aligning direction (Y-direction Y) inside the insertion concave portion 45. Hence, the elastic piece portion 47 is prevented from being pried.

Moreover, the pair of side edges 4c and 4d of the insertion convex portion 12 is supported by the guide protrusions 55 and 56. Hence, the guide protrusions 55 and 56 receive the load from the insertion convex portion 12.

Referring to FIG. 14B, the contact pressure applied to the circuit board 4 is received by the box-like portion 33. The edge portion 402 of the circuit board 4 makes contact with and is received by the front wall 27 of the housing 13 and positioned thereby in the insertion direction P1.

Next, referring to FIG. 11, the corresponding outer lead 10 is attached to the pair of first elastic piece portions 31 and 32 of the connector 6, whereby electrical contact is secured between the first elastic piece portions 31 and 32 and the corresponding outer lead 10. More specifically, first, the operation member 15 is held at the widening position. Hence, the pair of widening operation portions 72 widens the distance between the pair of first elastic piece portions 31 and 32.

In this state, the main portion of the corresponding cold-cathode tube is held by hand or a jig (not shown), and the outer lead 10 is opposed to the operation member 15 in the attachment direction M1. Then, the outer lead 10 is moved along the attachment direction M1, whereby the outer lead 10 is disposed between the pair of straight portions 66 inside the receiving cavity 17.

Next, the operation member 15 is moved in the first Z-direction Z1, whereby the operation member 15 is displaced from the widening position to the widening release position shown in FIG. 12. Hence, the engagement of the pair of engaging portions 63 by the pair of widening operation portions 72 is released. As a result, by the elastic force of the pair of elastic piece portions 31 and 32, the pair of straight portions 66 elastically sandwiches the corresponding outer lead 10.

At this time, the pair of straight portions 66 makes contact with the corresponding outer lead 10 described above, whereby electrical connection is established between the straight portions 66 and the corresponding outer lead 10. The outer lead 10 of the cold-cathode tube is electrically connected to the conductive pattern of the circuit board via the contact forming member 14.

In addition, the distance between the pair of first narrow portions 65 and the distance between the pair of second narrow portions 67 are become narrower than the diameter of the corresponding outer lead 10. Furthermore, by the displacement of the operation member 15 to the widening release position, the pair of pressure application portions 79 press the corresponding tip end portions 61b. Hence, the tip end portions 61b are made close to each other by the pair of pressure application portions 79. As a result, a pressure force for narrowing the distance between the straight portions 66 is applied. The force for sandwiching the corresponding outer lead 10 is enhanced by the pair of straight portions 66.

Moreover, by the displacement of the operation member 15 to the widening release position, the base end portions 61a of the pair of first piece portions 61 push the tip end portions 68 of the corresponding second piece portions 62, thereby making the tip end portions 68 close to each other.

By the narrowing in the distance between the pair of tip end portions 68 as described above, a pressure force for narrowing the distance between the pair of straight portions 66 is applied. The force for sandwiching the outer lead 10 by the pair of straight portions 66 is enhanced further.

On the other hand, the work for disassembling the liquid crystal display device is carried out as described below. That is, first, the connection between the outer lead 10 and the corresponding contact forming member 14 is released. More specifically, the operation member 15 is moved from the widening release position (see FIG. 12) in the second Z-direction Z2, thereby being displaced to the widening position (see FIG. 11).

When the operation member 15 is displaced to the widening position, the second inclined cam surfaces 82 of the pair of widening operation portions 72 engage the corresponding pair of engaging portions 63, whereby the distance between the pair of engaging portions 63 is widened. As the distance between the pair of engaging portions 63 becomes larger, the distance between the pair of straight portions 66 is widened. The electrical connection between the pair of straight portions 66 and the corresponding outer lead 10 is released.

Next, while the main portion of the cold-cathode tube is held by hand or a jig, the outer lead 10 is moved in the detachment direction M2, and the outer lead 10 is detached from the receiving cavity 17.

After the cold-cathode tube is detached from the connector 6, the connector 6 is detached from the circuit board. More specifically, as shown in FIG. 14B, the insertion convex portion 12 being inserted into the insertion concave portion 45 is slid with respect to the connector 6 in the extraction direction P2, and the insertion convex portion 12 is extracted from the insertion concave portion 45 so as to be in the state shown in FIG. 14A.

As described above, in this embodiment, the insertion convex portion 12 inserted in the insertion concave portion 45 is wrapped with the box-like portion 33. Hence, the insertion convex portion 12 to which contact pressure is applied from the circuit board connecting contact 34 can be received by the box-like portion 33 so as not to come away from the circuit board connecting contact 34.

Hence, the contact pressure between the circuit board connecting contact 34 and the conductive pattern 8 of the insertion convex portion 12 can be sufficiently secured. In addition, since the box-like portion 33 is made of a metal, the box-like portion 33 can be prevented from being softened and deformed by heat in a temperature condition (for example, up to a hundred and several tens of degrees C.) in which the electric connector 6 is used. As a result, the box-like portion 33 for receiving the insertion convex portion 12 can receive the insertion convex portion 12 without being deformed by heat, regardless of the temperature condition at the time of use. Hence, the contact pressure can be maintained stably.

In addition, the circuit board connecting contact 34 is extended from the second wall 42 of the box-like portion 33. With this configuration, the circuit board connecting contact 34 can be extended from a position of the box-like portion 33 being opposed to the conductive pattern 8 and being close thereto.

Furthermore, the contact portion 475 is formed on the elastic piece portion 47 of the circuit board connecting contact 34. With this configuration, the elastic piece portion 47 makes elastic contact with the conductive pattern 8 of the insertion convex portion 12. Hence, contact pressure can be sufficiently secured between the elastic piece portion 47 and the conductive pattern 8, and this contact pressure can be securely maintained.

Moreover, since the elastic piece portion 47 is supported by the second wall 42, the load applied to the elastic piece portion 47 can be securely received by the second wall 42.

Furthermore, the elastic piece portion 47 is U-shaped. With this configuration, the elastic piece portion 47 can have sufficient flexibility. As a result, as the insertion convex portion 12 is inserted into the insertion concave portion 45, the elastic piece portion 47 can be sufficiently elastically deformed and can securely make elastic contact with the conductive pattern 8 of the insertion convex portion 12. Additionally, since the fixed piece portion 46 is disposed along the second wall 42 so as to make close contact with at least part of the second wall 42, the second wall 42 can be reinforced.

Further, in the elastic piece portion 47, the contact portion 475 is formed on the main body portion 472 extending from the curved portion 471 along the insertion direction P1. With this configuration, the movable amount of the contact portion 475 due to the elastic deformation of the elastic piece portion 47 can be made large.

In addition, the contact portion 475 is formed at the tip end of the first inclined portion 473 of the main body portion 472. With this configuration, the movable amount of the contact portion 475 due to the elastic deformation of the elastic piece portion 47 can be made larger.

Further, the second inclined portion 474 is extended from the first inclined portion 473 of the elastic piece portion 47. Hence, the tip end of the first inclined portion 473 can be prevented from scratching the insertion convex portion 12.

Furthermore, when the elastic piece portion 47 is bent, the tip end of the second inclined portion 474 is received by the second wall 42 via the fixed piece portion 46. This can prevent the elastic piece portion 47 from being bent more than necessary and prevent the stress applied to the elastic piece portion 47 from becoming large.

Moreover, the pair of portions 477 and 478 defined by the slit 476 is formed on the elastic piece portion 47, and the tip ends of the pair of portions 477 and 478 constitute the tip end of the elastic piece portion 47. With this configuration, the pair of portions 477 and 478 of the elastic piece portion 47 can be elastically deformed independently from each other. Hence, the flexibility of the elastic piece portion 47 can be raised when the elastic piece portion 47 makes contact with the insertion convex portion 12. As a result, it is possible to prevent the contact pressure between the elastic piece portion 47 and the insertion convex portion 12 from rising excessively.

Further, the insertion of the insertion convex portion 12 into the insertion concave portion 45 is guided by the guide protrusions 55 and 56 formed respectively on the third and fourth walls 43 and 44 of the box-like portion 33. With this configuration, it is possible to prevent the insertion convex portion 12 from being inserted in a direction away from the insertion direction P1. It is also possible to prevent the insertion convex portion 12 from making contact with a portion different from the intended contact portion (the contact portion 475) of the elastic piece portion 47.

As a result, it is possible to prevent the elastic piece portion 47 from being deformed elastically in a manner different from the intended design, and it is also possible to prevent the elastic piece portion 47 from being subjected to excessive stress. The fatigue of the elastic piece portion 47 is thus suppressed, and its durability can be improved.

In addition, since the third and fourth walls 43 and 44 are provided with the guide protrusions 55 and 56, respectively, the guide protrusions 55 and 56 can support the pair of side edges 4c and 4d of the insertion convex portion 12. As a result, the insertion convex portion 12 can be inserted parallel with the first and second walls 41 and 42.

Furthermore, since the guide protrusions 55 and 56 receive the back surface 4b of the insertion convex portion 12, the insertion convex portion 12 is positioned in the thickness direction A of the insertion convex portion 12. Since the insertion convex portion 12 is positioned in the thickness direction A, the bending of the elastic piece portion 47 due to the insertion of the insertion convex portion 12 is restricted to a predetermined amount. Hence, the deformation amount of the elastic piece portion 47 due to the insertion of the insertion convex portion 12 can be prevented from becoming excessive, and the fatigue of the elastic piece portion 47 can be suppressed.

Moreover, the guide protrusions 55 and 56 receive the load from the insertion convex portion 12. With this configuration, the insertion convex portion 12 is securely supported by the guide protrusions 55 and 56. As a result, it is possible to prevent the circuit board 4 having a plate-like shape from being bent in the sideways direction of the insertion convex portion 12.

Furthermore, the insertion convex portion 12 inserted into the insertion concave portion 45 is sandwiched between the first wall 41 and the guide protrusions 55 and 56. Since the insertion convex portion 12 is sandwiched between the guide protrusions 55 and 56 and the first wall 41, the insertion convex portion 12 can be positioned.

Further, the contact forming member 14 is provided with the pair of first elastic piece portions 31 and 32 serving as a fluorescent tube connecting contact. Hence, electrical connection can be established between the cold-cathode tube 5 and the circuit board 4 using the single contact forming member 14.

In addition, since the contact forming member 14 is formed of a single metal plate, the number of components for the electric connector 6 can be reduced, and the production cost can also be reduced.

Furthermore, since at least part of the second inclined portion 474 of the elastic piece portion 47 faces a direction equivalent to the insertion direction P1, when the insertion convex portion 12 is inserted into the insertion concave portion 45, the tip end of the insertion convex portion 12 can be prevented from scratching the tip end of the elastic piece portion 47.

Moreover, the contact portion 475 of the elastic piece portion 47 is a surface formed by bending a plate material as a material for the contact forming member and is not a cut surface obtained at the time of press molding. Hence, the contact portion 475 can be formed of a plated layer by plating the above-mentioned plate material before press work. In other words, since a cut surface obtained by cutting the plate material is not used for the contact portion, it is not necessary to form the contact portion by performing plating after cut processing, whereby the production of the elastic piece portion 47 requires less time and effort.

Furthermore, the contact portion 475 is formed by a curled spring that is wide in the Y-direction Y being orthogonal to the insertion direction P1. As a result, the elastic piece portion 47 can be prevented from buckling when it makes contact with the insertion convex portion 12 that is inserted along the insertion direction P1.

Further, the contact portion 475 of the elastic piece portion 47 of the circuit board connecting contact 34 is divided into two pieces so as to be able to bend independently. With this configuration, the flexibility of the contact portion 475 can be enhanced, and the contact portion 475 can more easily follow the movement of the conductive pattern 8 of the insertion convex portion 12. The contact between the contact portion 475 and the conductive pattern 8 can thus be made more reliable.

For these reasons, electric power can be supplied to the circuit board connecting contact 34 via the conductive pattern 8 of the circuit board 4. Further, the electrical connection between the circuit board connecting contact 34 and the conductive pattern 8 of the circuit board 4 can be made reliable.

Further, solder is not required for the connection between the connector 6 and the insertion convex portion 12 of the circuit board 4. This is desirable from the perspective of conservation of the global environment. Additionally, costly soldering work is not necessary, and a cost reduction effect can also be obtained.

The present invention is not limited to the embodiments described above, but can be modified variously within the scope set forth in the appended claims.

In the following descriptions, the differences from the embodiment shown in FIGS. 1 to 14 will be explained, and similar configurations will be designated by similar numerals and the explanations thereof will be omitted.

Figure 15:
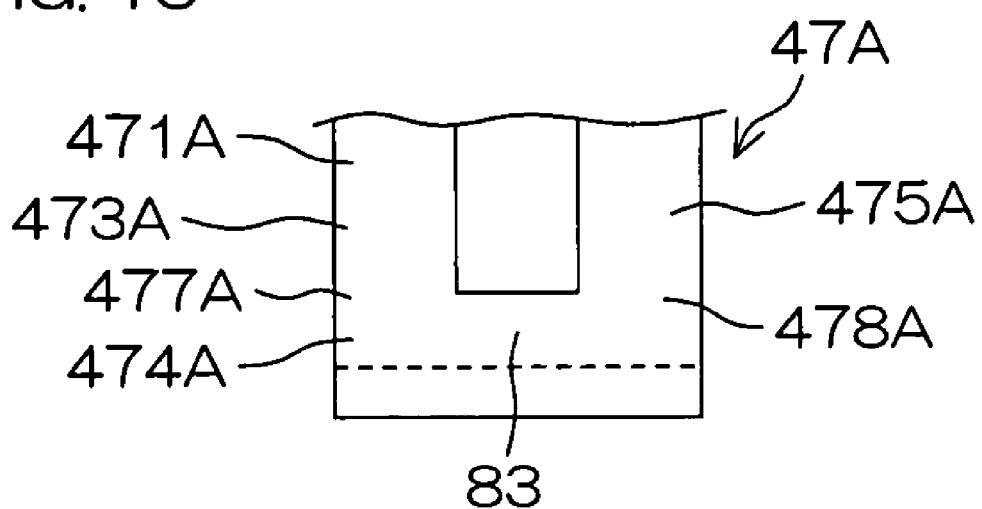
FIG. 15 is a view showing a main part according to another embodiment of the present invention.

For example, as shown in FIG. 15, a connection portion 83 for connecting the tip ends of a pair of portions 477A and 478A of an elastic piece portion 47A to each other may be provided. In this case, since the tip ends of the pair of portions 477A and 478A are connected to each other by the connection portion 83, the tip ends of the pair of portions 477A and 478A can be deformed together elastically. Hence, it is possible to prevent the rigidity of the above-mentioned pair of portions 477A and 478A from lowering excessively. As a result, the fatigue of the elastic piece portion 47A can be suppressed.

Figure 16:
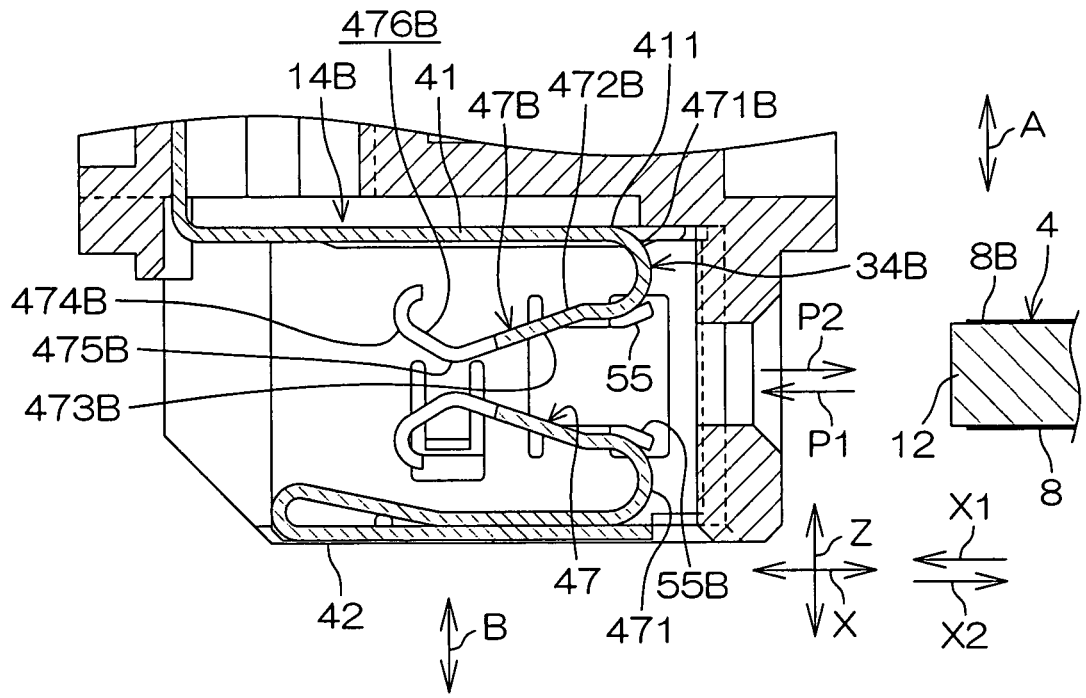
FIG. 16 is a sectional view showing a main part according to still another embodiment of the present invention.
Figure 17:
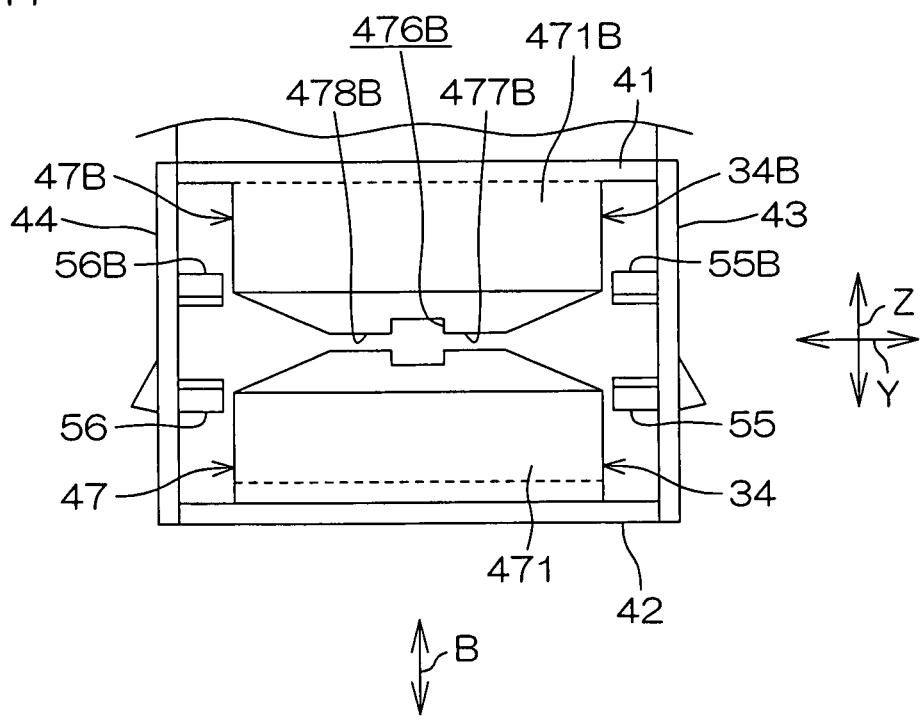
FIG. 17 is a view showing a main part at the time when a contact forming member shown in FIG. 16 is viewed along the insertion direction.

In addition, as shown in FIGS. 16 and 17, a contact forming member 14B provided with a circuit board connecting contact 34B extended from the first wall 41 may also be used. In this case, the elastic piece portion 47B of the circuit board connecting contact 34B is extended from the first end portion 411 of the first wall 41 and has a shape being symmetrical with the elastic piece portion 47 with respect to the opposed direction B.

The elastic piece portion 47B is bent in a U-shape from the first end portion 411 of the first wall 41 and extends in the insertion direction P1. The elastic piece portion 47B has a configuration similar to that of the elastic piece portion 47, and includes a curved portion 471B being curled so as to be convex in the extraction direction P2 and a main body portion 472B extending from the curved portion 471B in the insertion direction P1.

The base end portion of the curved portion 471B continues to the first end portion 411 of the first wall 41 and is supported by the first end portion 411.

A first inclined portion 473B of the main body portion 472 is farther from the first wall 41 in the insertion direction P1. A contact portion 475B is formed at the tip end of the first inclined portion 473B.

A second inclined portion 474B extends from the tip end of the first inclined portion 473B and is inclined so as to be closer to the first wall 41 in the insertion direction P1.

The elastic piece portion 47B includes a pair of portions 477B and 478B defined by a slit 476B extending along the insertion direction P1. The pair of portions 477B and 478B includes part of the tip end side of the first inclined portion 473B and the second inclined portion 474B.

The slit 476B is disposed at generally the central position of the elastic piece portion 47B in the width direction. The pair of portions 477B and 478B can be elastically deformed independently from each other. The tip ends of the pair of portions 477B and 478B constitute the tip end of the elastic piece portion 47B.

In addition, the third wall 43 and the fourth wall 44 are each provided with a pair of guide protrusions.

The pair of guide protrusions 55 and 55B of the third wall 43 are disposed so as to be opposed to each other and be spaced away from each other in the mutually opposed direction B of the first and second walls 41 and 42. The pair of guide protrusions 55 and 55B are disposed between the curved portions 471 and 471B of the elastic piece portions 47 and 47B in the opposed direction B.

The pair of guide protrusions 56 and 56B of the fourth wall 44 are disposed so as to be opposed to each other and spaced away from each other in the opposed direction B. The pair of guide protrusions 56 and 56B are disposed between the curved portions 471 and 471B of the elastic piece portions 47 and 47B in the opposed direction B.

The guide protrusions 55 and 56 are arranged parallel with the first wall 41. Similarly, the guide protrusions 55B and 56B are arranged parallel with the first wall 41.

Furthermore, a conductive pattern 8B is formed on the front surface 4a of the insertion convex portion 12 of the circuit board 4. The conductive pattern 8B is generally symmetrical with the conductive pattern 8 in the thickness direction A.

Referring to FIG. 18, with the above-mentioned configuration, when the insertion convex portion 12 is inserted into the insertion concave portion 45, the insertion convex portion 12 is sandwiched between the pair of guide protrusions 55 and 55B and the pair of guide protrusions 56 and 56B (in FIG. 18, only the pair of guide protrusions 55 and 55B is shown).

The insertion convex portion 12 is inserted along the insertion direction P1 while being sandwiched between the pair of guide protrusions 55 and 55B and between the pair of guide protrusions 56 and 56B.

Hence, the conductive pattern 8 of the insertion convex portion 12 makes contact with the contact portion 475 of the elastic piece portion 47 with a predetermined contact pressure. In addition, the conductive pattern 8B of the insertion convex portion 12 makes contact with the contact portion 475B of the elastic piece portion 47B with a predetermined contact pressure. At this time, the insertion convex portion 12 is elastically sandwiched by the pair of elastic piece portions 47 and 47B. The tip end of the main body portion 472B of the elastic piece portion 47B is directly received by the first wall 41.

With this embodiment, a U-shaped portion is formed in the elastic piece portion 47B. Hence, the elastic piece portion 47B can obtain sufficiently secure flexibility. As a result, as the insertion convex portion 12 is inserted into the insertion concave portion 45, the U-shaped portion of the elastic piece portion 47B can be sufficiently elastically deformed and can securely make elastic contact with the conductive pattern 8B of the insertion convex portion 12.

In addition, the insertion convex portion 12 inserted in the insertion concave portion 45 is sandwiched between the pair of guide protrusions 55 and 55B of the third wall 43 and between the pair of guide protrusions 56 and 56B of the fourth wall 44. With this configuration, the positioning of the insertion convex portion 12 in the opposed direction B can be securely carried out. Furthermore, it is possible to prevent the elastic deformation amounts of the circuit board connecting contact 34B extended from the first wall 41 and the circuit board connecting contact 34 extended from the second wall 42 due to the insertion of the insertion convex portion 12 from becoming excessive.

Moreover, since the circuit board connecting contacts 34 and 34B are provided, the insertion convex portion 12 of the circuit board 4 can be elastically sandwiched between the pair of elastic piece portions 47 and 47B. Hence, the contact pressure to the conductive patterns 8 and 8B of the insertion convex portion 12 of the circuit board 4 can be raised further. Furthermore, the conductive patterns 8 and 8B are provided on the back surface 4b and the front surface 4a of the insertion convex portion 12, and these can be made contact with the two elastic piece portions 47 and 47B.

A fixed piece portion similar to the fixed piece portion 46 may be disposed between the elastic piece portion 47B and the first wall 41.

Figure 19B:
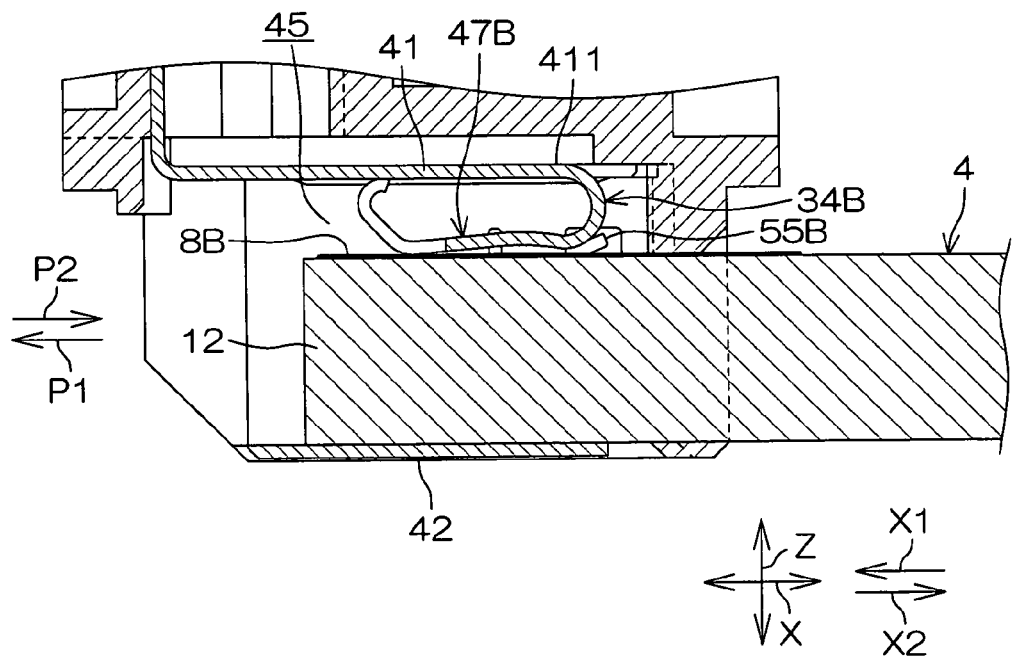

In addition, as shown in FIG. 19A, it may be possible to abolish the elastic piece portion 47 and to use a contact forming member 14' provided with only the elastic piece portion 47B. In this case, the elastic piece portion is extended from only the first wall 41. At this time, as shown in FIG. 19B, the insertion convex portion 12 inserted into the insertion concave portion 45 is sandwiched between the second wall 42 and the guide protrusions 55B and 56B (in FIG. 19B, only the guide protrusion 55B is shown).

Furthermore, as shown in FIG. 20A, a contact forming member 14C having an elastic piece portion 47C may be provided. The contact forming member 14C differs from the contact forming member 14 shown in FIG. 8 in that the elastic piece portion 47C is directly extended from the first end portion 421 of the second wall 42.

In this case, the second inclined portion 474C of the elastic piece portion 47C is directly received by the second wall 42 as shown in FIG. 20B when the elastic piece portion 47C is bent.

Moreover, as shown in FIG. 21A, it may be possible to use a contact forming member 14C' provided with the elastic piece portion 47B extended from the first wall 41 and the elastic piece portion 47C extended from the second wall 42.

In this case, when the insertion convex portion 12 is inserted into the insertion concave portion 45, the contact portion 475B of the elastic piece portion 47B makes contact with the conductive pattern 8B of the insertion convex portion 12 as shown in FIG. 21B. Furthermore, a contact portion 475C of the elastic piece portion 47C makes contact with the conductive pattern 8 of the insertion convex portion 12.

The tip end of the elastic piece portion 47B is directly received by the first wall 41. The tip end of the elastic piece portion 47C is directly received by the second wall 42.

In addition, a contact forming member 14D shown in FIG. 22 may also be provided. Referring to FIG. 22 and FIG. 23A as a sectional view taken along the line XXIIIA-XXIIIA of FIG. 22, one of the features of this embodiment is that an elastic piece portion 47D of the contact forming member 14D extends in the second X-direction X2.

The box-like portion 33D of the contact forming member 14 has a top plate portion 84 extending from the lower portion 37 of the main body portion 30 along the second X-direction X2. A third wall 43D is extended from the tip end of the top plate portion 84 with respect to the first Y-direction Y1.

A second wall 42D is extended from the tip end of the third wall 43D with respect to the first Z-direction Z1. A fourth wall 44D is extended from the tip end of the second wall 42D with respect to the second Y-direction Y2.

A first wall 41D is extended from the tip end of the fourth wall 44D with respect to the second Z-direction Z2. This first wall 41D is overlaid with the lower side (the side in the first Z-direction Z1) of the top plate portion 84, whereby they are reinforced with each other.

The elastic piece portion 47D is extended from a second end portion 412D of the first wall 41D. The elastic piece portion 47D is bent into a U-shape from the above-mentioned second end portion 412D and extends in the extraction direction P2.

The elastic piece portion 47D includes a curved portion 471D continuing to the second end portion 412D of the first wall 41D, and a main body portion 472D extending from the curved portion 471D in the extraction direction P2. The curved portion 471D is curled so as to be convex in the insertion direction P1. The base end portion of the curved portion 471D is disposed along the top plate portion 84. The elastic piece portion 47D can bend while the second end portion 412D of the first wall 41D is used as a fulcrum.

The main body portion 472 includes a first inclined portion 473D that is inclined so as to be closer to the first wall 41D in the extraction direction P2, and a second inclined portion 474D that is inclined so as to be farther from the first wall 41D in the extraction direction P2.

The first inclined portion 473D continues to the tip end of the curved portion 471D and is inclined at a generally constant inclination in the extraction direction P2. A contact portion 475D is formed at the tip end of this first inclined portion 473D.

The second inclined portion 474D is extended from the tip end of the first inclined portion 473D. The boundary portion of the first and second inclined portions 473D and 474D has a raised shape being curved smoothly.

A guide piece 86 is formed at the first end portion 421D of the second wall 42D. The guide piece 86 is used to guide the insertion of the insertion convex portion 12 into the insertion concave portion 45 and prevents the tip end of the insertion convex portion 12 from being caught by the tip end of the second inclined portion 474D. This prevents the elastic piece portion 47D from buckling.

The guide piece 86 is curled so as to be convex from the second wall 42D in the extraction direction P2. When the elastic piece portion 47D is viewed along the insertion direction P1, the guide piece 86 covers the tip end of the second inclined portion 474D.

A restricting piece portion 85 for restricting the bending of the elastic piece portion 47D is formed on the second wall 42D. The restricting piece portion 85 extends generally parallel with the first inclined portion 473D and is opposed to the first wall 41D in the opposed direction B so as to sandwich the first inclined portion 473D therebetween. The first inclined portion 473D is received by the restricting piece portion 85, whereby the first inclined portion 473D is restricted from moving toward the second wall 42D side.

A pressing convex portion 87 protruding toward the contact portion 475D of the elastic piece portion 47D is formed on the first wall 41D. The pressing convex portion 87 has a flat surface and is opposed to the contact portion 475D of the elastic piece portion 47D.

When the insertion convex portion 12 of the circuit board 4 is inserted into the insertion concave portion 45 along the insertion direction P1, the insertion convex portion 12 is in a state shown in FIG. 23B. The insertion convex portion 12 inserted into the insertion concave portion 45 is disposed between the pressing convex portion 87 and the elastic piece portion 47D. The insertion convex portion 12 inserted into the insertion concave portion 45 is thus sandwiched between the elastic piece portion 47D and the first wall 41D.

As a result, the insertion convex portion 12 makes elastic pressure contact with the contact portion 475D while being received by the pressing convex portion 87. At this time, the elastic piece portion 47D to which a reaction force is applied from the circuit board 4 is received by the restricting piece portion 85. Hence, the bending of the elastic piece portion 47D is restricted. Furthermore, the tip end of the second inclined portion 474D of the elastic piece portion 47D is directly received by the second wall 42D.

As described above, in this embodiment, the elastic piece portion 47D is U-shaped. Hence, the elastic piece portion 47D can obtain sufficiently secure flexibility. As a result, as the insertion convex portion 12 is inserted into the insertion concave portion 45, the elastic piece portion 47D can be sufficiently elastically deformed and can securely make elastic contact with the conductive pattern 8 of the insertion convex portion 12.

In addition, in the elastic piece portion 47D, the contact portion 475D is formed on the main body portion 472D extending in the extraction direction P2. With this configuration, the movable amount of the contact portion 475D due to the elastic deformation of the elastic piece portion 47D can be made large.

Furthermore, the contact portion 475D is formed at the tip end of the first inclined portion 473D. With this configuration, the movable amount of the contact portion 475D due to the elastic deformation of the elastic piece portion 47D can be made larger.

Furthermore, the second inclined portion 474D is extended from the first inclined portion 473D. Hence, the tip end of the first inclined portion 473D can be prevented from scratching the insertion convex portion 12.

Moreover, the insertion convex portion 12 inserted into the insertion concave portion 45 can be elastically sandwiched between the elastic piece portion 47D and the first wall 41D from which the elastic piece portion 47D is extended.

Further, since the elastic piece portion 47D is received by the restricting piece portion 85, the elastic deformation of the elastic piece portion 47D can be restricted. Hence, the contact pressure to the insertion convex portion 12 can be raised further. Furthermore, since the pressing convex portion 87 receives the insertion convex portion 12, the insertion convex portion 12 of the circuit board 4 can be restricted from moving in the thickness direction A thereof. As a result, the contact pressure between the insertion convex portion 12 and the contact portion 475D can be raised further.

Furthermore, the tip end of the second inclined portion 474D of the elastic piece portion 47D is directly received by the second wall 42D. This can prevent the elastic piece portion 47D from being bent more than necessary and prevent the stress applied to the elastic piece portion 47D from becoming large.

Furthermore, a contact forming member 14E shown in FIG. 24A may also be provided. The contact forming member 14E mainly differs from the contact forming member 14D shown in FIG. 23A in the following points. That is, a first inclined portion 473E of a main body portion 472E of an elastic piece portion 47E is inclined so as to be farther from the first wall 41D in the extraction direction P2, and a second inclined portion 474E extending from the first inclined portion 473E is inclined so as to be closer to the first wall 41D in the extraction direction P2.

When the insertion convex portion 12 is inserted into the insertion concave portion 45 along the insertion direction P1, the insertion convex portion 12 is in a state shown in FIG. 24B. Hence, the insertion convex portion 12 is sandwiched between the main body portion 472E of the elastic piece portion 47E and the second wall 42D. The insertion convex portion 12 is received by a pressing piece portion 87E of the second wall 42D. At this time, the conductive pattern 8 makes elastic contact with a contact portion 475E of the elastic piece portion 47E. The tip end of the second inclined portion 474E is directly received by the first wall 41D.

In this case, the contact portion 475E is formed at the tip end of the first inclined portion 473E. With this configuration, the movable amount of the contact portion 475E due to the elastic deformation of the elastic piece portion 47E can be made larger.

In addition, the second inclined portion 474E is inclined so as to be closer to the first wall 41D in the extraction direction P2. With this configuration, the tip end of the first inclined portion 473E can be prevented from scratching the insertion convex portion 12.

Furthermore, the insertion convex portion 12 inserted into the insertion concave portion 45 can be elastically sandwiched between the elastic piece portion 47E and the second wall 42D from which the elastic piece portion 47E is not extended.

Moreover, a contact forming member 14F shown in FIG. 25A may also be used. This contact forming member 14F mainly differs from the contact forming member 14D shown in FIG. 23A in that an elastic piece portion 47F is extended from the second wall 42D.

The elastic piece portion 47F is extended from a second end portion 422D of the second wall 42D, bent in a U-shape, and further extended in the extraction direction P2.

The elastic piece portion 47F includes a curved portion 471F continuing to the second end portion 422D of the second wall 42D and a main body portion 472F extended from the tip end of the curved portion 471F.

The curved portion 471F continues to the second end portion 422D of the second wall 42D and is curled so as to be convex in the insertion direction P1. The main body portion 472F extends from the tip end of the curved portion 471F along the extraction direction P2.

The main body portion 472F includes a first inclined portion 473F that is inclined so as to be closer to the second wall 42D in the extraction direction P2 and a second inclined portion 474F extends from tip end of the first inclined section 473F and that is inclined so as to be farther from the second wall 42D in the extraction direction P2. A contact portion 475 is formed at the tip end of the first inclined portion 473F.

A pressing convex portion 87F is formed on the second wall 42D. The pressing convex portion 87F is opposed to the contact portion 475F in the opposed direction B.

When the insertion convex portion 12 is inserted into the insertion concave portion 45 along the insertion direction P1, the insertion convex portion 12 is in a state shown in FIG. 25B. Hence, the insertion convex portion 12 is sandwiched between the elastic piece portion 47F and the second wall 42D. The conductive pattern 8 makes elastic contact with the contact portion 475F of the elastic piece portion 47F while the insertion convex portion 12 is received by the pressing convex portion 87F of the second wall 42D. In addition, the tip end of the second inclined portion 474F is directly received by the first wall 41D.

Furthermore, a contact forming member 14G shown in FIG. 26A may also be used. This contact forming member 14G mainly differs from the contact forming member 14F shown in FIG. 25A in the following points.

That is, a first inclined portion 473G of an elastic piece portion 47G is inclined so as to be farther from the second wall 42D in the extraction direction P2, and a second inclined portion 474G is inclined so as to be closer to the second wall 42D in the extraction direction P2.

When the insertion convex portion 12 is inserted into the insertion concave portion 45 along the insertion direction P1, the insertion convex portion 12 is in a state shown in FIG. 26B. Hence, the insertion convex portion 12 is sandwiched between a main body portion 472G of the elastic piece portion 47G and the first wall 41D. The insertion convex portion 12 is received by the pressing convex portion 87 of the first wall 41D, and the conductive pattern 8 makes elastic contact with a contact portion 475G of the elastic piece portion 47G. At this time, the tip end of the second inclined portion 474G is directly received by the second wall 42D.

Furthermore, a contact forming member 14H shown in FIG. 27A may also be provided. This contact forming member 14H differs from the contact forming member 14E shown in FIG. 24A in that a contact forming member 14G (see FIG. 26A) is further provided.

The insertion convex portion 12 inserted into the insertion concave portion 45 is elastically sandwiched between the pair of elastic piece portions 47E and 47G. The contact portion 475E of the elastic piece portion 47E makes contact with the conductive pattern 8B formed on the front surface 4a of the insertion convex portion 12. The contact portion 475G of the elastic piece portion 47G makes contact with the conductive pattern 8 formed on the back surface 4b of the insertion convex portion 12.

Furthermore, a contact forming member 14J shown in FIG. 28A may also be provided. This contact forming member 14J mainly differs from the contact forming member 14 shown in FIG. 8 in the following point. That is, a slit 476J of an elastic piece portion 47J extends in the generally entire range of the elastic piece portion 47J in the longitudinal direction of the elastic piece portion 47J.

The slit 476J is disposed at the generally central position in the width direction of the elastic piece portion 47J. The slit 476J extends from the base end portion of a curved portion 471J of the elastic piece portion 47J to the tip end of a second inclined portion 474J. The elastic piece portion 47J includes a pair of portions 477J and 478J defined by the slit 476J.

Each of the pair of portions 477J and 478J includes the curved portion 471J, a first inclined portion 473J and the second inclined portion 474J. The pair of portions 477J and 478J can be elastically deformed independently form each other.

The tip ends of the pair of portions 477J and 478J are connected to each other by a connection portion 83J. The tip end of the connection portion 83J is curled toward the fixed piece portion 46 and can make smooth contact with the fixed piece portion 46.

Referring to FIGS. 28A and 28B, the lateral width of the portion 477J is constant in the curved portion 471J. In addition, the groove width of the portion 477J is narrower in the insertion direction P1 in the first inclined portion 473J. Furthermore, the lateral width of the portion 477J is narrower in the insertion direction P1 in the second inclined portion 474J.

Similarly, the lateral width of the other portion 478J is constant in the curved portion 471J. In addition, the groove width of the other portion 478J is narrower in the insertion direction P1 in the first inclined portion 473J. Furthermore, the lateral width of the other portion 478J is narrower in the insertion direction P1 in the second inclined portion 474J.

A width C1 of the slit 476J in the curved portion 471J is constant. A width C2 of the slit 476J in the first inclined portion 473J is narrower in the insertion direction P1. A width C3 of the slit 476J in the second inclined portion 474J is narrower in the insertion direction P1.

Referring to FIGS. 28B and 28C, swelled portions 92 and 93 are formed at the boundary portion of the first inclined portion 473J and the second inclined portion 474J. The swelled portion 92 is formed on the one portion 477J at the boundary portion between the first inclined portion 473J and the second inclined portion 474J. The swelled portion 93 is formed on the other portion 478J at the boundary portion between the first inclined portion 473J and the second inclined portion 474J.

The swelled portions 92 and 93 each have a shape curved so as to be convex toward the first wall 41. When viewed along the extraction direction P2, the swelled portions 92 and 93 each have an arc shape. A contact portion 475J making contact with the insertion convex portion is formed in each of the swelled portions 92 and 93.

With the above-mentioned configuration, the swelled portions 92 and 93 can make smooth contact with the insertion convex portion, and proper contact pressure can be secured between the swelled portions 92 and 93 and the insertion convex portion.

For these reasons, by the use of the contact forming member 14J, the pair of portions 477J and 478J of the elastic piece portion 47J can be elastically deformed independently of each other. Hence, since the flexibility of the swelled portions 92 and 93 making contact with the insertion convex portion 12 can be raised, the contact pressure to the insertion convex portion 12 can be prevented from rising excessively.

In addition, the tip ends of the pair of portions 477J and 478J are connected by the connection portion 83J. With this configuration, the tip ends of the pair of portions 477J and 478J can be deformed together elastically. Hence, it is possible to prevent the elastic deformation amount of the elastic piece portion 47J from increasing excessively, whereby the fatigue of the elastic piece portion 47J can be suppressed.

In each embodiment described above, the conductive pattern of the insertion convex portion 12 inserted into the insertion concave portion 45 should only make contact with the connection portion of at least one elastic piece portion. Hence, the conductive pattern should only be formed on at least one of the front surface and the back surface of the insertion convex portion 12.

In addition, it may also be possible that a plurality of the connectors 6 shown in FIG. 2, are prepared and that these connectors 6 may be held collectively by a single holder 94 as shown in FIGS. 29A and 29B. With this configuration, the plurality of insertion convex portions 12 can be inserted collectively into the corresponding insertion concave portions 45.

The holder 94 has a plate-like shape, and a plurality of insertion holes 95 are formed thereon sideways. The housings 13 of the corresponding connectors 6 are inserted into the insertion holes 95. A flange portion 96 is formed around the outer periphery of each housing 13. The flange portion 96 is press-fitted in the peripheral surface of the corresponding insertion hole 95 and secured thereto. Part of each housing 13 protrudes from the holder 94, and each insertion concave portion 45 is exposed.

The holder 94 may also be used to hold the electric connector in each embodiment described above.

In addition, in the embodiment shown in FIG. 14, a ground bar 100 shown in FIG. 30 and serving as a connection member may also be used instead of the circuit board 4. The ground bar 100 is a plate-like member made of a metal and is entirely used as a conductive portion. The ground bar 100 includes a rectangular main body portion 101 and a plurality of insertion convex portions 103 formed sideways at an edge portion 102 of a main body portion 101 (only two insertion convex portions 103 are shown in FIG. 30).

The edge portion 102 constitutes the end portion of the ground bar 100 on the side of the first X-direction X1. The above-mentioned insertion convex portions 103 are formed sideways in the Y-direction Y so as to correspond to the respective connectors 6.

The insertion convex portion 103 has a rectangular shape, and both a front surface 103a and a back surface 103b thereof are used as conductive portions. The front surface 103a is opposed to the first wall of the box-like portion, and the back surface 103b is opposed to the second wall of the box-like portion.

A side edge 103c, one of a pair of side edges 103c and 103d of each insertion convex portion 103, is opposed to the third wall of the box-like portion, and the other side edge 103d is opposed to the fourth wall of the box-like portion.

The insertion convex portion 103 is inserted into the insertion concave portion 45 of the corresponding connector 6 along the insertion direction P1 and is attached thereto. As a result, the insertion convex portion 103 is electrically connected to the elastic piece portion 47. Ground bar connecting contacts 34K of the plurality of electric connectors 6 are collectively connected in parallel by the ground bar 100. The main body portion 101 is grounded to the metal frame 104 of a liquid crystal display device.

Hence, the ground bar connecting contact 34K as a connection member connecting contact is grounded to the metal frame 104 (conductive material frame) of the liquid crystal display device via the ground bar 100.

For these reasons, with this embodiment, the electrical connection between the ground bar connecting contact 34K and the ground bar 100 can be securely established.

The ground bar 100 may also be used to connect the electric connectors in the respective embodiments described above.

Further, an electric power supply bar as a connection member (conductive plate) having the similar construction as the ground bar 100 can be used. Referring to FIG. 31, the electric power supply bar 100L mainly differs from the ground bar 100 in the following points. That is, an inverter circuit 7L is connected to a main body portion 101 of the electric power supply bar 100L, and electric power from the inverter circuit 7L is supplied to an electric power supply bar connecting contact 34L as a connecting member connecting contact via the electric power supply bar 100L. The voltage applied by the inverter circuit 7L is a positive potential or a negative potential.

In this case, electric power can be supplied to the electric power supply bar connecting contact 34L from the electric power supply bar 100L.

The electric power supply bar 100L may be used for the connection to the electric connector in each of the above embodiments.

Further, as shown in FIG. 32, the conductive pattern 8 of the circuit board 4 may be grounded to the metal frame 104. The circuit board connecting contact 34 is grounded to the metal frame 104 via the conductive pattern 8.

The electric connector in each of the above embodiments may be grounded to the metal frame 104 via the conductive pattern 8.

In addition, the present invention can also be applied to the connection to other fluorescent tubes such as external electrode fluorescent lamp. Furthermore, the present invention can further be applied to an edge light type liquid crystal display device.

Although the present invention has been described in detail by way of specific embodiments, those skilled in the art comprehending the above descriptions would be able to readily conceive modifications, changes and equivalents thereof. The present invention therefore should have the scope of the appended claims and the scope equivalent thereto.

The present application corresponds to Japanese Patent Application No. 2006-176802 filed at the Japan Patent Office on Jun. 27, 2006 and to Japanese Patent Application No. 2007-150656 filed at the Japan Patent Office on Jun. 6, 2007, the entire disclosures of which are herein incorporated by reference.

The invention claimed is:

1. An electric connector to be attached to a plate-like connection member having an edge portion, a plurality of insertion convex portions formed sideways at the edge portion, and a conductive portion formed on at least one surface of each of the insertion convex portions, comprising:
an insulating housing; and
a contact forming member made of a metal and held in the housing, wherein
the contact forming member includes a box-like portion having four walls and a connection member connecting contact extended from at least one of the walls of the box-like portion,
the four walls define an insertion concave portion into which the corresponding insertion convex portion is inserted along a predetermined insertion direction, and
the connection member connecting contact is disposed in the insertion concave portion, is surrounded by the four walls and includes a contact portion that makes contact with the conductive portion of the corresponding insertion convex portion inserted into the insertion concave portion.

2. An electric connector to be attached to a plate-like connection member having an edge portion, a plurality of insertion convex portions formed sideways at the edge portion, and a conductive portion formed on at least one surface of each of the insertion convex portions, comprising:
an insulating housing; and
a contact forming member made of a metal and held in the housing, wherein
the contact forming member includes a box-like portion having four walls and a connection member connecting contact extended from at least one of the walls of the box-like portion,
the four walls define an insertion concave portion into which the corresponding insertion convex portion is inserted along a predetermined insertion direction, and
the connection member connecting contact includes a contact portion that makes contact with the conductive portion of the corresponding insertion convex portion inserted into the insertion concave portion, wherein
the four walls of the box-like portion include first and second walls opposed respectively to the front surface and the back surface of the insertion convex portion and third and fourth walls opposed respectively to a pair of side edges of the insertion convex portion, and
the connection member connecting contact is extended from at least one of the first and second walls.

3. The electric connector according to claim 2, wherein
the connection member connecting contact includes an elastic piece portion supported by the walls from which the connection member connecting contact is extended, and
the contact portion is formed on the elastic piece portion.

4. The electric connector according to claim 3, wherein
the four walls of the box-like portion have first end portions being relatively close to an entrance of the insertion concave portion and second end portions being relatively away from the entrance of the insertion concave portion, and
the elastic piece portion is supported by a first end portion of the wall from which the connection member connecting contact including the elastic piece portion is extended.

5. The electric connector according to claim 4, wherein
the connection member connecting contact includes a fixed piece portion continuing to the second end portion of the wall from which the connection member connecting contact is extended,
the fixed piece portion is bent so that at least part thereof makes close contact with the wall from which the connection member connecting contact is extended, and
the elastic piece portion is bent in a U-shape from an end portion of the fixed piece portion and extends in the predetermined insertion direction.

6. The electric connector according to claim 4, wherein
the elastic piece portion is bent in a U-shape from the first end portion of the wall from which the connection member connecting contact including the elastic piece portion is extended and extends in the predetermined insertion direction.

7. The electric connector according to claim 4, wherein
the elastic piece portion includes a curved portion curled so as to be convex in a direction opposite to the predetermined insertion direction and a main body portion extending from the curved portion along the predetermined insertion direction, and
the contact portion is formed on the main body portion.

8. The electric connector according to claim 7, wherein
the main body portion of the elastic piece portion includes a first inclined portion inclined so as to be farther from the wall, by which the elastic piece portion is supported, in the predetermined insertion direction, and the contact portion is formed at a tip end of the first inclined portion.

9. The electric connector according to claim 8, wherein the main body portion includes a second inclined portion extended from the first inclined portion and inclined so as to be closer to the wall, from which the elastic piece portion is extended, in the predetermined insertion direction.

10. The electric connector according to claim 9, wherein when the elastic piece portion is bent, a tip end of the second inclined portion is received directly or indirectly by the wall by which the elastic piece portion is supported.

11. The electric connector according to claim 7, wherein the elastic piece portion includes a pair of portions defined by a slit extending along the predetermined insertion direction, and tip ends of the pair of portions constitute a tip end of the elastic piece portion.

12. The electric connector according to claim 11, wherein the elastic piece portion includes a connection portion for connecting the tip ends of the pair of portions to each other.

13. The electric connector according to claim 4, wherein guide protrusions are formed respectively on the third and fourth walls of the box-like portion, and the guide protrusions guide insertion of the insertion convex portion into the insertion concave portion.

14. The electric connector according to claim 13, wherein the guide protrusions receive the corresponding surface of the front surface and the back surface of the insertion convex portion, whereby the insertion convex portion is positioned in a thickness direction of the insertion convex portion, and by the positioning of the insertion convex portion, bending of the corresponding elastic piece portion due to the insertion of the insertion convex portion is restricted to a predetermined amount.

15. The electric connector according to claim 13, wherein the guide protrusions receive a load applied from the insertion convex portion.

16. The electric connector according to claim 13, wherein the connection member connecting contact is extended only from one of the first and second walls, and the insertion convex portion inserted into the insertion concave portion is sandwiched between the other one of the first and second walls and the guide protrusions.

17. The electric connector according to claim 13, wherein the connection member connecting contacts are extended from the first and second walls, respectively, the guide protrusions of the third wall and the guide protrusions of the fourth wall include a pair of guide protrusions opposed to each other so as to be kept away in a mutually opposed direction of the first and second walls, and the insertion convex portion inserted into the insertion concave portion is sandwiched between the pair of guide protrusions.

18. The electric connector according to claim 3, wherein the four walls of the box-like portion have first end portions being relatively close to the entrance of the insertion concave portion and second end portions being relatively away from the entrance of the insertion concave portion, and the elastic piece portion is extended from the second end portion of the first or second wall, bent in a U-shape and extended in the direction opposite to the insertion direction.

19. The electric connector according to claim 18, wherein the elastic piece portion includes a curved portion continuing to the second end portion of the wall from which the elastic piece portion is extended and curling so as to be convex in the predetermined insertion direction, and a main body portion extending from the curved portion in the direction opposite to the predetermined insertion direction, and the contact portion is formed on the main body portion.

20. The electric connector according to claim 19, wherein the main body portion includes a first inclined portion inclined so as to be closer to the wall, from which the elastic piece portion is extended, in the direction opposite to the predetermined insertion direction, and the contact portion is formed at the tip end of the first inclined portion.

21. The electric connector according to claim 20, wherein the main body portion includes a second inclined portion extended from the first inclined portion and inclined so as to be farther from the wall, from which the elastic piece portion is extended, in the direction opposite to the predetermined insertion direction.

22. The electric connector according to claim 20, wherein the insertion convex portion inserted into the insertion concave portion is sandwiched between the elastic piece portion and the wall from which the elastic piece portion is extended.

23. The electric connector according to claim 19, wherein the main body portion of the elastic piece portion includes a first inclined portion inclined so as to be farther from the wall, from which the elastic piece portion is extended, in the direction opposite to the predetermined insertion direction, and the contact portion is formed at the tip end of the first inclined portion.

24. The electric connector according to claim 23, wherein the main body portion includes a second inclined portion extended from the first inclined portion and inclined so as to be closer to the wall, from which the elastic piece portion is extended, in the direction opposite to the predetermined insertion direction.

25. The electric connector according to claim 23, wherein the insertion convex portion inserted into the insertion concave portion is sandwiched between the elastic piece portion and the first or second wall from which the elastic piece portion is not extended.

26. The electric connector according to claim 18, wherein when the elastic piece portion is bent, the tip end of the elastic piece portion is directly received by the first or second wall.

27. An electric connector to be attached to a plate-like connection member having an edge portion, a plurality of insertion convex portions formed sideways at the edge portion, and a conductive portion formed on at least one back surface of each of the insertion convex portions, comprising:

an insulating housing; and a contact forming member made of a metal and held in the housing, wherein the contact forming member includes a box-like portion having four walls and a connection member connecting contact extended from at least one of the walls of the box-like portion, the four walls define an insertion concave portion into which the corresponding insertion convex portion is inserted along a predetermined insertion direction, and the connection member connecting contact includes a contact portion that makes contact with the conductive portion of the corresponding insertion convex portion inserted into the insertion concave portion, wherein the contact forming member includes fluorescent tube connecting contacts to which the terminal of an end portion of the corresponding fluorescent tube is attached to establish electrical connection.

28. The electric connector according to claim 2, wherein the contact forming member is formed of a single metal plate.

29. A connection structure for an electric connector, comprising:

a plate-like connection member; and a plurality of electric connectors to be attached to the connection member, wherein the connection member has an edge portion, a plurality of insertion convex portions formed sideways at the edge portion, and a conductive portion formed on at least one surface of each insertion convex portion, the electric connector has an insulating housing and a contact forming member made of a metal and held in the housing, the contact forming member includes a box-like portion having four walls and a connection member connecting contact extended from at least one of the walls of the box-like portion, the four walls are partitioned to form an insertion concave portion into which the insertion convex portion corresponding thereto is inserted along a predetermined insertion direction, and the connection member connecting contact is disposed in the insertion concave portion, is surrounded by the four walls and includes a contact portion that makes contact with the conductive portion of the corresponding insertion convex portion inserted into the insertion concave portion.

30. The connection structure for the electric connector according to claim 29, wherein the connection member includes a circuit board, and the conductive portion includes a conductive pattern of the circuit board.

31. The connection structure for the electric connector according to claim 30, wherein electric power is supplied to the connection member connecting contact of each of the electric connectors via the conductive pattern.

32. The connection structure for the electric connector according to claim 30, wherein the connecting member connecting contact of each of the electric connectors is grounded via the conductive pattern.

33. The connection structure for the electric connector according to claim 29, wherein the connection member includes a conductive plate which connects collectively circuit board connecting contacts of each of the electric connectors in parallel.

34. The connection structure for the electric connector according to claim 33, wherein electric power is supplied to the connection member connecting contact of each of the electric connectors via the conductive plate.

35. The connection structure for the electric connector according to claim 33, wherein the connection member connecting contact of each of the electric connectors is grounded via the conductive plate.

* * * * *